US011448677B2

(12) United States Patent
Everroad

(10) Patent No.: US 11,448,677 B2
(45) Date of Patent: Sep. 20, 2022

(54) SYSTEM AND METHOD FOR MEASURING FIELDS OVER DISTANCE

(71) Applicant: CPG Technologies, LLC, Italy, TX (US)

(72) Inventor: Kendol C. Everroad, Midlothian, TX (US)

(73) Assignee: CPG Technologies, LLC, Italy, TX (US)

(*) Notice: Subject to any disclaimer, the term of this patent is extended or adjusted under 35 U.S.C. 154(b) by 182 days.

(21) Appl. No.: 16/796,074

(22) Filed: Feb. 20, 2020

(65) Prior Publication Data

US 2021/0263090 A1      Aug. 26, 2021

(51) Int. Cl.
*G01R 29/08* (2006.01)
*G01R 33/00* (2006.01)

(52) U.S. Cl.
CPC ..... *G01R 29/0892* (2013.01); *G01R 33/0023* (2013.01)

(58) Field of Classification Search
CPC . G01R 29/0892; G01R 33/0023; G01R 29/14
USPC .......................................................... 324/260
See application file for complete search history.

(56) References Cited

U.S. PATENT DOCUMENTS

| | | | |
|---|---|---|---|
| 9,893,403 B2 | 2/2018 | Corum et al. | |
| 9,899,718 B2* | 2/2018 | Corum | H01P 3/00 |
| 9,910,144 B2 | 3/2018 | Corum et al. | |
| 9,912,031 B2 | 3/2018 | Corum et al. | |
| 9,923,385 B2 | 3/2018 | Corum et al. | |
| 9,941,566 B2 | 4/2018 | Corum et al. | |
| 10,027,116 B2 | 7/2018 | Corum et al. | |
| 10,031,208 B2* | 7/2018 | Lilly | G01S 5/0294 |
| 10,153,638 B2 | 12/2018 | Corum et al. | |
| 10,193,595 B2 | 1/2019 | Corum et al. | |
| 10,224,589 B2 | 3/2019 | Corum et al. | |
| 10,326,190 B2 | 6/2019 | Corum et al. | |

(Continued)

FOREIGN PATENT DOCUMENTS

WO     2016195738 A1     12/2016

OTHER PUBLICATIONS

U.S. Appl. No. 13/789,538, filed Mar. 7, 2013.
U.S. Appl. No. 15/894,176, filed Feb. 12, 2018.
U.S. Appl. No. 13/789,525, filed Mar. 7, 2013.
U.S. Appl. No. 15/894,145, filed Feb. 12, 2018.
U.S. Appl. No. 14/483,089, filed Sep. 10, 2014.

(Continued)

*Primary Examiner* — Christopher P McAndrew
(74) *Attorney, Agent, or Firm* — Thomas Horstemeyer, LLP

(57) ABSTRACT

The present disclosure involves positioning a plurality of metering devices positioned along a terrestrial medium relative to a Zenneck waveguide probe in order to generate field measurements of the wireless output of such Zenneck waveguide probe. A computing device configures each of the metering devices for operation at an operating frequency. Each of the metering devices generates field measurements over time during the testing of the Zenneck waveguide probe. The field measurements from each of the metering devices are stored in a data store, where the field measurements indicate a wireless signal output of the Zenneck surface waveguide probe. A user interface is generated and rendered on a display that indicates a field strength over distance of the wireless signal output of the Zenneck surface waveguide probe. The metering devices include various components to facilitate taking the field measurements.

29 Claims, 12 Drawing Sheets

(56) References Cited

U.S. PATENT DOCUMENTS

| | | | |
|---|---|---|---|
| 10,355,480 | B2 | 7/2019 | Corum et al. |
| 10,408,916 | B2* | 9/2019 | Corum .................. G01S 1/00 |
| 10,560,147 | B1 | 2/2020 | Corum et al. |
| 10,630,111 | B2 | 4/2020 | Corum et al. |
| 10,680,306 | B2 | 6/2020 | Corum et al. |
| 2014/0252865 | A1 | 9/2014 | Corum et al. |
| 2014/0252886 | A1 | 9/2014 | Corum et al. |
| 2016/0072300 | A1 | 3/2016 | Corum et al. |
| 2016/0079753 | A1* | 3/2016 | Corum .................. H01Q 1/00 307/149 |
| 2016/0079754 | A1* | 3/2016 | Corum .................. H01Q 9/30 333/248 |
| 2016/0111890 | A1* | 4/2016 | Corum .................. H02J 50/10 307/104 |
| 2016/0359335 | A1 | 12/2016 | Corum et al. |
| 2016/0359336 | A1 | 12/2016 | Corum et al. |
| 2017/0077893 | A1 | 3/2017 | Corum et al. |
| 2017/0078037 | A1* | 3/2017 | Corum .................. H04J 3/06 |
| 2018/0106845 | A1 | 4/2018 | Corum et al. |
| 2018/0151934 | A1 | 5/2018 | Corum et al. |
| 2018/0166884 | A1 | 6/2018 | Corum et al. |
| 2018/0175630 | A1* | 6/2018 | Lilly .................. G08B 13/2405 |
| 2018/0180729 | A1 | 6/2018 | Corum et al. |
| 2018/0183128 | A1 | 6/2018 | Corum et al. |
| 2018/0198183 | A1 | 7/2018 | Corum et al. |
| 2018/0262053 | A1 | 9/2018 | Corum et al. |
| 2018/0309289 | A1 | 10/2018 | Corum et al. |
| 2019/0058327 | A1 | 2/2019 | Corum et al. |
| 2019/0132025 | A1 | 5/2019 | Corum et al. |
| 2020/0287264 | A1 | 9/2020 | Corum et al. |
| 2020/0388896 | A9 | 12/2020 | Corum et al. |

OTHER PUBLICATIONS

U.S. Appl. No. 15/915,507, filed Mar. 8, 2018.
U.S. Appl. No. 16/289,954, filed Mar. 1, 2019.
U.S. Appl. No. 14/848,653, filed Sep. 9, 2015.
U.S. Appl. No. 16/017,516, filed Jun. 25, 2018.
U.S. Appl. No. 16/168,248, filed Oct. 23, 2018.
U.S. Appl. No. 14/728,507, filed Jun. 2, 2015.
U.S. Appl. No. 16/234,086, filed Dec. 27, 2018.
U.S. Appl. No. 14/728,492, filed Jun. 2, 2015.
U.S. Appl. No. 15/889,827, filed Feb. 6, 2018.
U.S. Appl. No. 15/238,041, filed Aug. 16, 2016.
U.S. Appl. No. 15/878,607, filed Jan. 24, 2018.
U.S. Appl. No. 15/909,596, filed Mar. 1, 2018.
U.S. Appl. No. 16/881,120, filed May 22, 2020.
U.S. Appl. No. 16/708,048, filed Dec. 9, 2019.
Author Unknown, Potomac Instruments, Inc., Field Intensity Meter Model FIM-41 Operating Instructions, Feb. 1, 2001 (FEb. 1, 2001), pp. 1-8, XP055795411, Potomac Instruments website Retrieved from the Internet: URL:https://pi-usa.com/wp-content/uploads/2018/03/41-inst2.pdf [retrieved on Apr. 14, 2021].
Hanna et al., Very-Low-Frequency Electromagnetic Field Detector With Data Acquisition, IEEE Transactions on Instrumentation and Measurement, IEEE Service Center, Piscataway, NJ, US, vol. 58, No. 1, Jan. 1, 2009 (Jan. 1, 2009), pp. 129-140, XP011229991, ISSN: 0018-9456, DOI: 10.1109/TIM.2008.927191.
Written Opinion for PCT Application PCT/IB2021/051406 filed on Feb. 19, 2021.
International Search Report for PCT Application PCT/IB2021/051406 dated Apr. 23, 2021.

* cited by examiner

| Configuration Data 196 | |
|---:|:---|
| Name of Test: | 150KHz Test on 1-1-2019 |
| Trace Center Frequency: | 150KHz |
| Trace Span: | 10KHz |
| Resolution Bandwidth: | 1.99 Hz |
| Reference Level: | 52 mV/m |
| Units: | mV/m |
| Deg CCW from True N: | 42 |
| Preamp/Filter State: | ON |

SYSTEM AND METHOD FOR MEASURING FIELDS OVER DISTANCE

BACKGROUND

For over a century, signals transmitted by radio waves involved radiation fields launched using conventional antenna structures. In contrast to radio science, electrical power distribution systems in the last century involved the transmission of energy guided along electrical conductors. This understanding of the distinction between radio frequency (RF) and power transmission has existed since the early 1900's.

BRIEF DESCRIPTION OF THE DRAWINGS

For a more complete understanding of the embodiments and the advantages thereof, reference is now made to the following description, in conjunction with the accompanying figures briefly described below. The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

FIG. 9 illustrates a data structure that includes configuration data that is used to configure the operation of the metering device of FIG. 7 according to various embodiments of the present disclosure.

DETAILED DESCRIPTION

Figure 1:
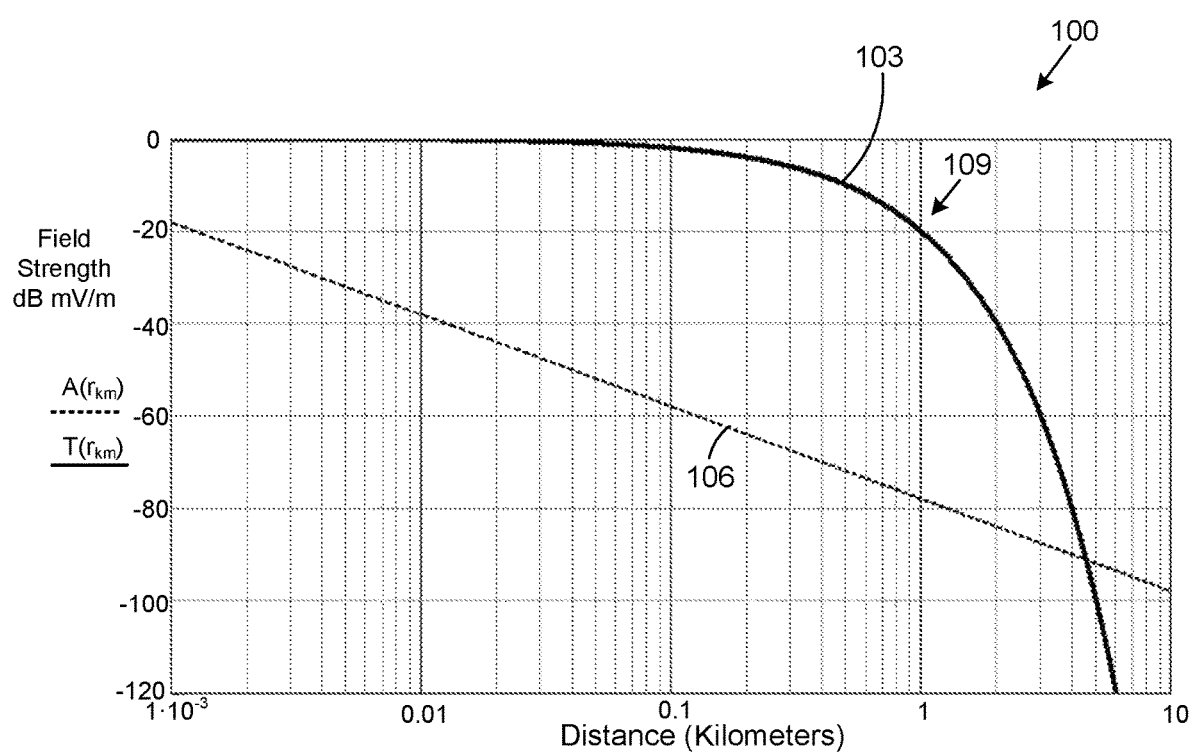
FIG. 1 is a graph that shows examples of field strength over distance of a radiation wave and a Zenneck surface wave.

To begin, some terminology shall be established to provide clarity in the discussion of concepts to follow. First, as contemplated herein, a formal distinction is drawn between radiated electromagnetic fields and guided electromagnetic field such as a Zenneck surface wave.

As contemplated herein, a radiated electromagnetic field comprises electromagnetic energy that is emitted from a source structure in the form of waves that are not bound to a waveguide. For example, a radiated electromagnetic field is generally a field that leaves an electric structure such as an antenna and propagates through the atmosphere or other medium and is not bound to any waveguide structure. Once radiated electromagnetic waves leave an electric structure such as an antenna, they continue to propagate in the medium of propagation (such as air) independent of their source until they dissipate regardless of whether the source continues to operate. Once electromagnetic waves are radiated, they are not recoverable unless intercepted, and, if not intercepted, the energy inherent in the radiated electromagnetic waves is lost forever. Electrical structures such as antennas are designed to radiate electromagnetic fields by maximizing the ratio of the radiation resistance to the structure loss resistance. Radiated energy spreads out in space and is lost regardless of whether a receiver is present. The energy density of the radiated fields is a function of distance due to geometric spreading. Accordingly, the term "radiate" in all its forms as used herein refers to this form of electromagnetic propagation.

A guided electromagnetic field is a propagating electromagnetic wave whose energy is concentrated within or near boundaries between media having different electromagnetic properties. In this sense, a guided electromagnetic field is one that is bound to a waveguide and may be characterized as being conveyed by the current flowing in the waveguide. If there is no load to receive and/or dissipate the energy conveyed in a guided electromagnetic wave, then no energy is lost except for that dissipated in the conductivity of the guiding medium. Stated another way, if there is no load for a guided electromagnetic wave, then no energy is consumed. Thus, a generator or other source generating a guided electromagnetic field does not deliver real power unless a resistive load is present. To this end, such a generator or other source essentially runs idle until a load is presented. This is akin to running a generator to generate a 60 Hertz electromagnetic wave that is transmitted over power lines where there is no electrical load. It should be noted that a guided electromagnetic field or wave is the equivalent to what is termed a "transmission line mode." This contrasts with radiated electromagnetic waves in which real power is supplied at all times in order to generate radiated waves. Unlike radiated electromagnetic waves, guided electromagnetic energy does not continue to propagate along a finite length waveguide after the energy source is turned off. Accordingly, the term "guide" in all its forms as used herein refers to this transmission mode of electromagnetic propagation.

A Zenneck surface wave is one case of guided surface wave with certain characteristics. A Zenneck surface wave is an inhomogenous wave that has a phase velocity greater than the speed of light c. The Zenneck surface wave is the only known surface wave that has a phase velocity greater than the speed of light c. The Zenneck surface wave is inhomogeneous in that it is a transverse magnetic (TM) wave that includes both a vertical electric field component oriented in the vertical direction and a horizontal electric field component that is oriented in the direction of propagation of the Zenneck surface wave. Stated another way, an inhomogenous plane wave is one in which the planes of constant phase (normal to the interface) and the planes of constant amplitude (parallel to the interface) do not coincide. The vertical electric field component of a Zenneck surface wave is vertically polarized and decays exponentially as a function of height.

This contrasts with a radiated electromagnetic wave which is a homogeneous wave in that it has a vertical electric field component and a transverse magnetic field component, where both the electric and magnetic field components fall in a single plane. Accordingly, a radiated electromagnetic wave is also known as a transverse electromagnetic (TEM) wave.

To further illustrate the distinction between radiated and guided/Zenneck electromagnetic fields, reference is made to FIG. 1 that depicts graph 100 of field strength in decibels (dB) above an arbitrary reference in volts per meter as a function of distance in kilometers on a log-dB plot. The graph 100 of FIG. 1 depicts a Zenneck field strength curve 103 that shows the field strength of a Zenneck electromagnetic field as a function of distance. This Zenneck field strength curve 103 has an appearance that is similar to a transmission line mode. Also, the graph 100 of FIG. 1 depicts a radiated field strength curve 106 that shows the field strength of a radiated electromagnetic field as a function of distance. Of interest are the shapes of the curves 103/106 for radiation and for Zenneck wave propagation. The radiated field strength curve 106 falls off geometrically (1/d, where d is distance) and is a straight line on the log-log scale. The Zenneck field strength curve 103, on the other hand, has the characteristic exponential decay of $e^{-\alpha d}/\sqrt{d}$ and exhibits a distinctive knee 109. Thus, as shown, the field strength of a Zenneck electromagnetic field falls off at a rate of $e^{-\alpha d}/\sqrt{d}$, whereas the field strength of a radiated electromagnetic field falls off at a rate of 1/d, where d is the distance. Due to the fact that the Zenneck field strength curve 103 falls off exponentially, the Zenneck field strength curve 103 features the knee 109 as mentioned above.

Figure 2:
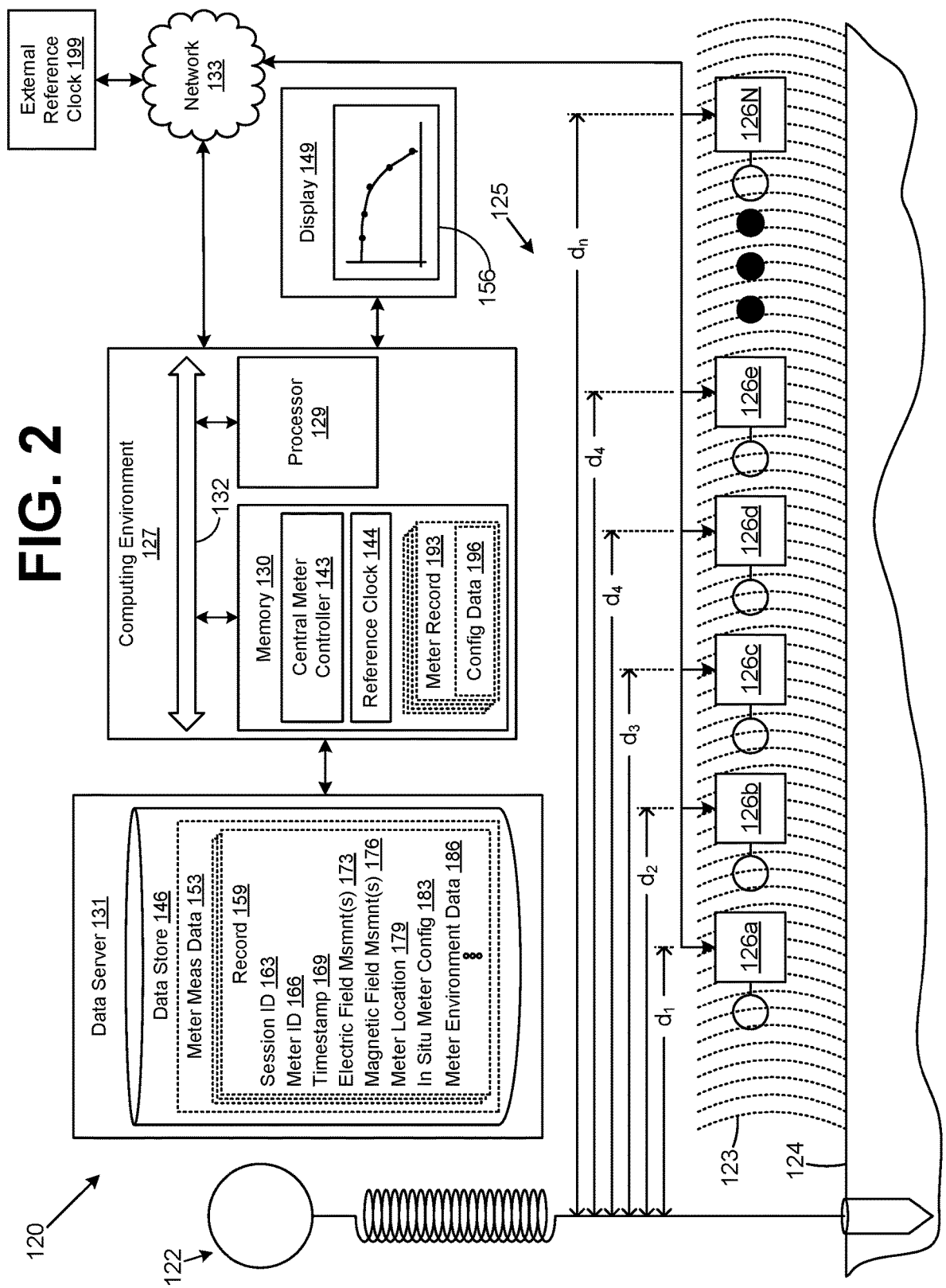
FIG. 2 is a drawing of a transmission measurement system according to various embodiments of the present disclosure.

The following discussion is provided in view of the drawings where exemplary embodiments are described in detail. With reference to FIG. 2, shown is a transmission measurement system 120 according to various embodiments of the present disclosure. The transmission measurement system 120 measures the output of a Zenneck waveguide probe 122 that is employed to transmit a Zenneck surface wave 123 along the surface of a lossy conducting medium 124. The lossy conducting medium 124 may comprise, for example, a terrestrial medium such as the planet Earth. To this end, such a terrestrial medium comprises all structures or formations included thereon whether natural or man-made. For example, such a terrestrial medium may comprise natural elements such as rock, soil, sand, fresh water, sea water, trees, vegetation, and all other natural elements that make up the planet Earth. In addition, such a terrestrial medium may comprise man-made elements such as concrete, asphalt, building materials, and other man-made materials. In other embodiments, the lossy conducting medium 124 may comprise some medium other than the Earth, whether naturally occurring or man-made. In the case that the lossy conducting medium 124 comprises a terrestrial medium or Earth, further shown is an atmospheric medium 125 that comprises the atmosphere above the ground. As such, the atmospheric medium 125 comprises air and other elements that make up the atmosphere of the Earth.

The Zenneck waveguide probe 122 depicted in FIG. 2 is merely representative of the various types of Zenneck waveguide probes that may be employed. Such Zenneck waveguide probes may comprise, for example, the Zenneck waveguide probes described in the following Patent Cooperation Treaty Applications Publications: Patent Cooperation Treaty Application Publication WO2014/137817 published on Sep. 12, 2014, Patent Cooperation Treaty Application Publication WO2016/039832 published on Mar. 17, 2016, Patent Cooperation Treaty Application Publication WO2016/195738 published on Dec. 8, 2016, and Patent Cooperation Treaty Application Publication WO2018/164965 published on Sep. 13, 2018, where each of these Patent Applications is incorporated herein by reference in its entirety. In addition, other approaches to generating Zenneck surface waves 123 may be employed such as the structures described in U.S. patent application Ser. No. 16/708,048 filed on Dec. 9, 2019 and entitled "Anisotropic Constitutive Parameters for Launching a Zenneck Surface Wave" which is incorporated herein by reference in its entirety.

It should be noted that the specific schematic elements of the Zenneck waveguide probe 122 depict a partial Zenneck waveguide probe and are merely representative of the various Zenneck waveguide probes and other approaches that may be employed to generate a Zenneck surface wave 123. Further discussion of examples of Zenneck waveguide probes 122 is provided with reference to later figures.

The transmission measurement system 120 includes several different metering devices 126a-N that are positioned on or above the lossy conducting medium 124 in the atmospheric medium 125. According to various embodiments, each metering device 126a-N is positioned a predefined distance $d_{1-n}$ from the Zenneck waveguide probe 122. In one embodiment, the distances $d_{1-n}$ may be specified so that the metering devices 126a-N are positioned such that they are evenly spaced or substantially evenly spaced with an approximately equal distance from metering device 126a to metering device 126N. In other embodiments, the metering devices 126a-N might be positioned in some other manner such as random placement such that the distances $d_{1-n}$ between the guided surface waveguide probe 122 and the respective metering devices 126a-N vary randomly, or that the difference or interval between two respective distances $d_{1-n}$ denoted as interval $d_x$–$d_{1-x}$ vary randomly as will be described.

The transmission measurement system 120 further includes a computing environment 127 that is coupled to a network 133. The computing environment 127 includes at least one processor circuit, for example, having a processor 129 and a memory 130, both of which are coupled to a local interface 132. To this end, the computing environment 127 may comprise, for example, at least one server computer or like device. The local interface 132 may comprise, for example, a data bus with an accompanying address/control bus or other bus structure as can be appreciated.

Stored in the memory 130 are both data and several components that are executable by the processor 129. In particular, stored in the memory 130 and executable by the processor 129 are a central meter controller 143, a reference clock 144, and potentially other applications. Alternatively, the reference clock 144 may reside within the circuitry of the processor 129 as can be appreciated. In addition, an operating system may be stored in the memory 130 and executable by the processor 129.

It is understood that there may be other applications that are stored in the memory 130 and are executable by the processor 129 as can be appreciated. Where any component discussed herein is implemented in the form of code, any one of a number of programming languages may be employed such as, for example, C, C++, C#, Objective C, Java, Javascript, Perl, PHP, Visual Basic, Python, Ruby, Delphi, Flash, or other programming languages.

The central meter controller 143 is stored in the memory 130 and is executable by the processor 129. In this respect, the term "executable" means a program file that is in a form that can ultimately be run by the processor 129. Examples of executable programs may be, for example, a compiled program that can be translated into machine code in a format that can be loaded into a random access portion of the memory 130 and run by the processor 129, source code that may be expressed in proper format such as object code that is capable of being loaded into a random access portion of the memory 130 and executed by the processor 129, or source code that may be interpreted by another executable program to generate instructions in a random access portion of the memory 130 to be executed by the processor 129, etc. An executable program may be stored in any portion or component of the memory 130 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 130 is defined herein as including both volatile and nonvolatile memory and data storage components. Volatile components are those that do not retain data values upon loss of power. Nonvolatile components are those that retain data upon a loss of power. Thus, the memory 130 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 129 may represent multiple processors 129 and the memory 130 may represent multiple memories 130 that operate in parallel processing circuits, respectively. In such a case, the local interface 132 may be an appropriate network that facilitates communication between any two of the multiple processors 129, between any processor 129 and any of the memories 130, or between any two of the memories 130, etc. The local interface 132 may comprise additional systems designed to coordinate this communication, including, for example, performing load balancing. The processor 129 may be of electrical or of some other available construction.

The computing environment 127 may also comprise various devices such as, for example, one or more programmable logic controllers or other types of computing devices.

The computing environment 127 is electrically coupled to and in communication with the network 133. The network 133 may comprise, for example, GPIB connections corresponding to IEEE 488.2, the Internet, intranets, extranets, wide area networks (WANs), local area networks (LANs), wired networks, wireless networks, or other suitable networks, etc., or any combination of two or more such networks. For example, such networks can include satellite networks, cable networks, Ethernet networks, and other types of networks.

The computing environment 127 is also in communication with a data server 131. The data server 131 may be electrically coupled directly to the computing environment 127 or the computing environment 127 may communicate with the data server through a network such as network 133. Each of the metering devices 126a-N is coupled to the network 133 such that each metering device 126a-N is in data communication with the computing environment 127.

A data store 146 is stored in the data server 131. The data store 146 may comprise, for example, a database or other data storage structure. A display device 149 is coupled to the computing environment 127. The central meter controller 143 performs various functions including configuring the metering devices 126a-N for operation, obtaining meter measurement data 153 and potentially other information from the metering devices 126a-N, and storing such meter measurement data 153 in the data store 146. In addition, the central meter controller 143 renders various user interfaces 156 on the display device 149 as will be described.

Various data is stored on the data store 146 that may be written, accessed, or changed by the central meter controller 143 executed on the computing environment 127. For example, stored on the data store 146 is meter measurement data 153 that sets forth field measurements and other data obtained from the metering devices 126a-N. The meter measurement data 153 includes, for example, several records 159, where each record 159 involves the recording of information at a given time from a metering device 126a-N during a given session. Each record 159 includes various information in various data fields such as, for example, a session identifier 163, a meter identifier 166, a timestamp 169, electric field measurements 173, magnetic field measurements 176, meter location 179, an in-situ meter configuration 183, meter environment data 186, and potentially other data. The fields in the record 159 may indicate, for example, conditions under which the field measurements 173/176 were obtained.

The session identifier 163 is common among a number of records 159 that are generated during a given session in which a test of a Zenneck waveguide probe 122 is performed. In such case, many records 159 may be generated by each respective one of the metering devices 126a-N over time during a given session. For example, a given session ID 163 may indicate records 159 generated during the test of a specific configuration of a Zenneck waveguide probe 122. During a session, a Zenneck waveguide probe 122 may be altered to determine the effect on the resulting electric and magnetic field strengths measured by the metering devices 126a-N.

The meter identifier 166 identifies a specific one of the metering devices 126a-N that generated the record 159 in which the meter identifier 166 appears. In this respect, each meter identifier 166 associated with a given metering device 126a-N is unique with respect to all other meter identifiers 166 associated with all other metering devices 126a-N.

The timestamp 169 indicates the time when the respective record 159 in which the timestamp 169 appears was created. Each metering device 126a-N includes a clock to generate the timestamp 169 when such metering device 126a-N creates a record 159 as will be described.

The electric field measurement 173 comprises a measurement of the electric field at the location of the metering device 126a-N. The electric field measurement 173 may comprise multiple electric field measurements taken across a single axis or across multiple axes. For example, for measurements taken across multiple axes, such measurements may be taken across 2 to 6 different axes. The electric field measurement 173 across a given axis may actually comprise multiple measurements taken across a predefined frequency band or range, otherwise known herein as a trace. For example, a given trace may be specified in terms of a range of frequency spectra defined by a center frequency and a span. The span defines the width of the range of the frequency spectra, where the center frequency is in the middle of the range. The frequency spectra of a given trace may also be defined in terms of a predefined low frequency and high frequency as well as a center frequency. A predefined number of electric field measurements 173 may be taken within a given trace, where each such electric field measurement 173 is taken at predefined intervals across the frequency spectra of the trace. In one embodiment, 1000 electric field measurements 173 may be taken in a single trace, where such electric field measurements 173 are evenly spaced across the frequency spectra of the trace. The number of electric field measurements 173 can be any number that can be reasonably obtained within a given time for proper operation. The electric field measurement 173 at the center frequency of a trace may be the ultimate frequency of interest, where the remaining measurements of the trace may indicate a degree of noise in the frequency spectrum of the trace and other information.

The magnetic field measurement 176 comprises a measurement of the magnetic field at the location of the metering device 126a-N. The magnetic field measurement 176 may comprise multiple magnetic field measurements 176 taken along a single axis or across multiple axes. For example, for measurements taken across multiple axes, such measurements may be taken across 2 to 6 different axes. With such measurements along 6 axes, one can determine the Poynting vector for the Zenneck surface waves 123. The measurements stored in the respective records 159 may define the Poynting vector determined from the field measurements along multiple axes as can be appreciated. The magnetic field measurement 176 across a given axis may actually comprise a trace of multiple measurements taken across a given frequency range. As was mentioned above, a given trace may be specified in terms of a center frequency and a span, a center frequency with a low and high frequency, or such a trace can be defined in some other manner. A predefined number of magnetic field measurements 176 may be taken within a given trace, where each such magnetic field measurement is taken at predefined intervals across the frequency spectra of the trace. In one embodiment, 1000 different magnetic field measurements 176 may be taken in a single trace, where such magnetic field measurements 176 are evenly spaced across the frequency spectrum of the trace. The number of magnetic field measurements 176 can be any number that can be reasonably obtained within a given time for proper operation. The magnetic field measurement 176 at the center frequency of a trace may be the ultimate frequency of interest, where the remaining measurements of the trace may indicate a degree of noise in the frequency spectra of the trace or may indicate other information.

The meter location 179 comprises a geographical location of the metering device 126a-N that generated the record in which the meter location 179 appears. The meter location 179 may be expressed in terms of geographical coordinates, GPS coordinates, or other coordinate system.

The in-situ meter configuration 183 includes one or more parameters with which each of the metering devices 126a-N were configured for operation in measuring electric and/or magnetic fields. Such a configuration may include the target frequency where electric and magnetic field strengths are to be measured. The in-situ meter configuration 183 may also specify information about the traces of field measurements such as a center frequency and span, a center frequency and low and high frequencies of the span, or other information specifying where measurements are taken. Such parameters may also include configuration data that determines how a Fourier transform is performed, if any, and the units of measure such as millivolts per meter or volts per meter, etc. Given that the in-situ meter configuration 183 is stored in the records 159, the state of the respective metering device 126a-N is known when the field measurements were taken.

The meter measurement data 153 further comprises meter environment data 186. The meter environment data 186 includes information about the environment within which the respective metering device 126a-N was located. To this end, each of the metering devices 126a-N includes one or more environmental sensors that are configured to generate a measurement of a factor associated with the environment in the vicinity of the respective metering device 126a-N. Specifically, the metering device 126a-N may include various sensors that determine temperature, humidity, and other parameters. In addition, other sensors may be included such as an accelerometer to detect undesireable movement of a respective metering device 126a-N. Also, a global positioning system (GPS) sensor and/or a compass may be included to sense position and orientation of a respective metering device 126a-N. In addition, further sensors may be included to take soil sigma measurements in the area around the respective metering device 126a-N. Sensors may also be included to determine the status of the various component devices in a given metering device 126a-N. In addition, sensors such as tamper switches, battery condition sensors, power input sensors, and other operational sensors may be used. The tamper switches would indicate if a third party has tampered with the metering devices 126a-N by opening a cover, etc. The battery condition sensors would provide the current status of any batteries that are used to power the metering device 126a-N. Power input sensors may indicate whether the input power to the metering devices 126a-N is experiencing problems such as low voltage or other conditions, where the power may be obtained from utility sources, solar panels, or other sources.

The metering device 126a-N may also communicate with external devices through the network 133 to obtain detailed weather information for the area where the metering device 126a-N is positioned. The meter environment data 186 may include other information about the environment surrounding the metering device 126a-N as can be appreciated.

In addition, a given record 159 may include other information not recited herein that may be useful in reviewing the field measurements taken and stored in such records 159 so that a reliable record of field measurements may be obtained.

Various systems are stored in memory accessible to the computing environment 127 and executable by the computing environment 127. Such memory may comprise a memory 130 or such memory may be located on a device remote to the computing environment 127 and accessed through the network 133. In addition, applications and data accessed and executed by the data server 131 may be stored in the data server 131 as can be appreciated.

Among the systems that are executable by the computing environment 127 is the central meter controller 143. The central meter controller 143 is executable in the computing environment 127 in order to configure the operation of the metering devices 126a-N, obtain records 159 from the metering devices 126a-N, generate and render user interfaces 156 on the display device 149 that depict the electric and magnetic field measurements 173/176 of the records 159 obtained, and perform other functions.

Stored in the memory 130 or other memory accessible to the computing environment 127 is data about the metering devices 126a-N. For each metering device 126a-N, stored is a meter record 193 that includes the meter identifier 166 associated with a respective one of the metering devices 126a-N. Each meter record 193 also includes current configuration data 196 that includes the parameters that specify the operation of the metering devices 126a-N. Such configuration data 196 may include the same parameters that are stored in the records 159 as the in-situ meter configuration 183 described above.

The user interface 156 that is rendered on the display device 149 is generated by the central meter controller 143 when executed in the computing environment 127. According to one aspect, the user interface 156 displays multiple electric and/or magnetic field measurements 173/176 from some or all of the metering devices 126a-N so that the nature of electromagnetic fields launched by the Zenneck surface waveguide probe 122 can be determined as will be discussed.

The external reference clock 199 comprises an external clock to which the reference clock 144 and clocks in each of the metering devices 126a-N may be synchronized to ensure that the reference clock 144 and the clocks in each of the metering devices 126a-N that are used to generate the timestamps 169 are accurate. The external reference clock 199 may comprise an Internet clock, an atomic clock, or other clock as can be appreciated.

Given the introduction of the various components of the transmission measurement system 120 set forth above, next a discussion of the operation of the same is provided. To begin, assume that it is desired to determine the signal output of a Zenneck waveguide probe 122. To accomplish this end, a number of metering devices 126a-N are positioned along the terrestrial medium relative to the Zenneck waveguide probe 122. In this respect, the metering devices 126a-N are each positioned at certain distances $d_{1-N}$ away from the Zenneck waveguide probe 122. The positions of the metering devices 126a-N may depend in part on geographical features, man-made structures, and other physical limitations. Once the metering devices 126a-N are positioned, a user may proceed to cause the central meter controller 143 to activate and configure each of the metering devices 126a-N for operation at a given frequency. In order to configure each of the metering devices 126a-N, the user first enters or otherwise specifies the configuration data 196 for the metering devices 126a-N so that electric and/or magnetic field measurements 173/176 may be taken. Among other parameters, the frequency of transmission at which measurements 173/176 are to be taken is specified as well as other information described above. Such information may be input using various input devices such as a keyboard, mouse, or other input device. Various user interfaces may be created that present mechanisms such as drop-down menus, picklists, input fields, and other mechanisms to facilitate entry of the configuration data 196.

As the configuration data 196 is entered, it is stored in the memory 130 or other memory as mentioned above. Thereafter, the central meter controller 143 communicates the configuration data 196 to each of the metering devices 126a-N that are to be used in obtaining field measurements 173/176.

The central meter controller 143 then takes action to ensure that the clocks that generate the timestamps 169 in each of the metering devices 126a-N are accurate. In one approach, this may be accomplished by ensuring the accuracy of the reference clock 144 relative to an external reference clock 199. Thereafter, the central meter controller 143 communicates with each of the metering devices 126a-N to obtain a current timestamp 169 from their respective clocks to determine accuracy of the clocks. In receiving current timestamps 169, any latency in the communication between the central meter controller 143 and the respective metering devices 126a-N may be predetermined and taken into account.

If the clock from a given metering device 126a-N is not the same as the reference clock 144 of the central meter controller 143, then the central meter controller 143 may calculate a delta between the reference clock 144 and the clock on the respective one of the metering devices 126a-N. The central meter controller 143 will then send a message to the respective metering device 126a-N directing that the clock of the metering device 126a-N be adjusted by the delta as needed in order to synchronize the clock of the metering device 126a-N with the reference clock 144 of the central meter controller 143 within a predefined time tolerance.

Alternatively, the central meter controller 143 may direct each of the metering devices 126a-N to synchronize their local clocks based on the external reference clock 199 where any communication latency between each of the metering devices 126a-N and the external reference clock 199 is taken into account such that the local clocks of the metering devices 126a-N are accurate with respect to the external reference clock 199 within a predefined time tolerance.

In addition, there may be other approaches that are used to synchronize the clocks of the respective metering devices 126a-N.

Once the reference clock 144 of the central meter controller 143 and the clocks of the metering devices 126a-N that are used to generate the timestamps 169 are synchronized, the central meter controller 143 and the metering devices 126a-N are ready to take field measurements 173/176. An excitation signal is applied to the Zenneck waveguide probe 122 and the transmission of a Zenneck surface wave 123 is attempted. The central meter controller 143 and the metering devices 126a-N are then employed to obtain field measurements 173/176 to memorialize the nature of the transmission of electromagnetic fields by the Zenneck waveguide probe 122 and to generate the user interface 156 on the display device 149 so that the nature of the transmission may be ascertained in near real time.

There are a couple of ways that the central meter controller 143 can initiate acquiring field measurements 173/176 from the metering devices 126a-N. In one approach, the central meter controller 143 sends a request for field measurements 173/176 to each of the metering devices 126a-N and, in response, the metering devices 126a-N acquire the field measurements 173/176, generate a record 159, and send the record 159 back to the central meter controller 143. Upon receipt of the record 159, the central meter controller 143 stores the same in the data store 146. The central meter controller 143 repeatedly performs the task of acquiring records 159 with field measurements 173/176 over time in a continuous manner such as in a repeating loop querying each metering device 126a-N in succession or at random until the field testing of the Zenneck waveguide probe 122 is complete. In each case, the field measurements 173/176 obtained indicate the wireless signal output of the Zenneck waveguide probe 122.

During the acquisition and storing of the records 159 that include the field measurements 173/176, the central meter controller 143 generates the user interface 156 to display the latest field measurements 173/176 on the display device 149. Specifically, the central meter controller 143 generates a curve from select ones of the field measurements 173/178 obtained from a plurality of the metering devices 126a-N. In this manner, the user interface 156 indicates the field strength over distance of the wireless signal output of the Zenneck waveguide probe 122. Such field strength may be the strength of a magnetic field or an electric field, although it may be most common to measure the strength of the electric field. The central meter controller 143 also calculates a curve from the latest received field measurements 173/176 using curve fitting techniques and generates a curve that represents the electromagnetic fields transmitted by the Zenneck waveguide probe 122. The central meter controller 143 may generate other reference curves that may be presented in the user interface 156 for purposes of comparison with the curve representative of the transmission of the Zenneck waveguide probe 122 as will be described.

Once the test of the Zenneck waveguide probe 122 is completed, the central meter controller 143 facilitates access to the records 159 stored in the data store 146 to review the nature of the transmission. A replay of the transmission may be implemented where the field measurements 173/176 are generated over time. In addition, the various information in the records 159 may be reviewed to determine if some condition may have affected the transmission of the Zenneck surface wave 123 in some manner.

Figure 3A:
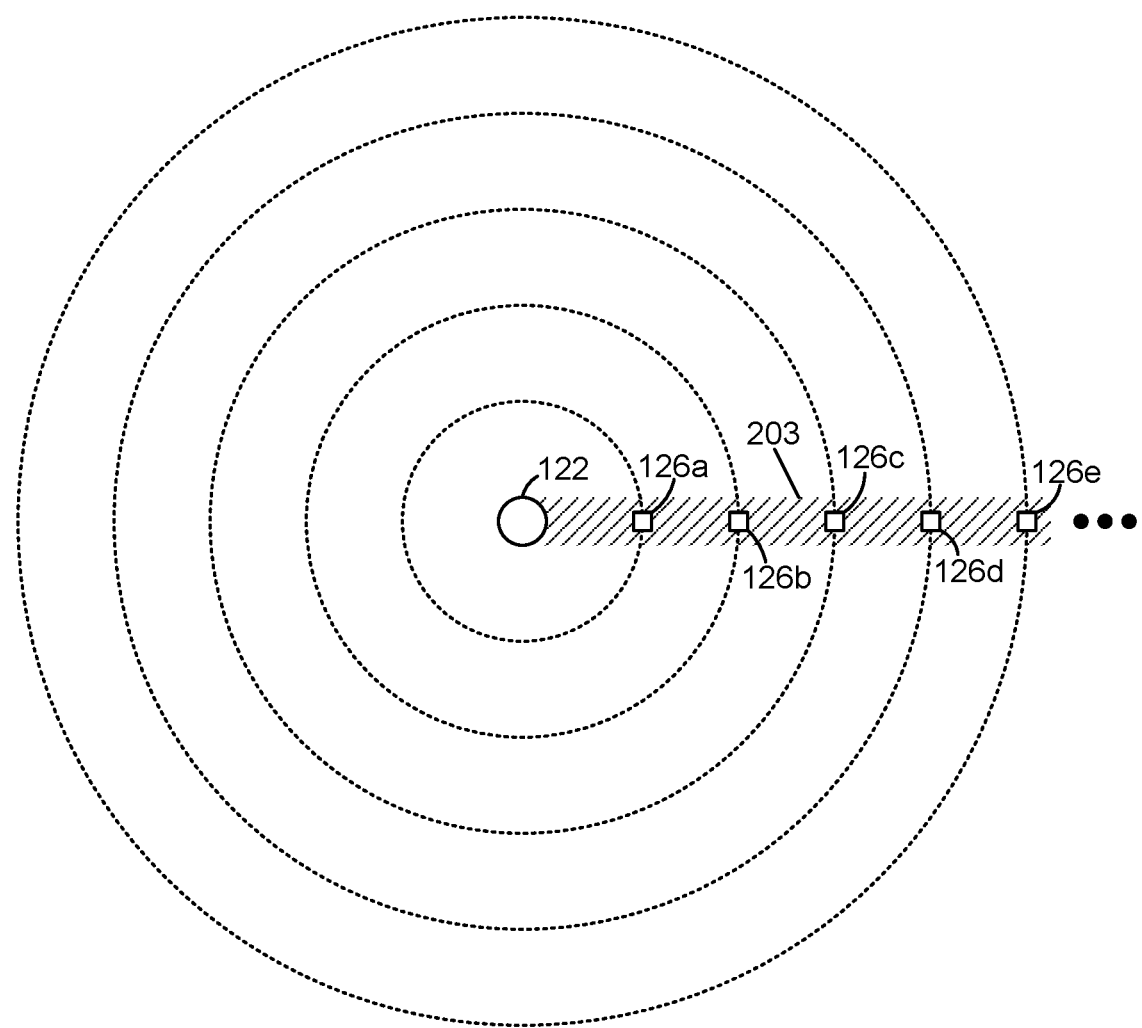
FIGS. 3A, 3B, and 3C depict the placement of metering devices of the transmission measurement system of FIG. 2 on a terrestrial medium according to various embodiments of the present disclosure.

Referring next to FIG. 3A, shown is one example placement of the metering devices 126a-N relative to the position of the Zenneck waveguide probe 122. Metering devices 126a, 126b, 126c, 126d, and 126e are depicted as being positioned at approximately even intervals to the extent terrain limits allow. The metering devices 126a-e are positioned within a defined corridor 203. Each metering device 126a-e is positioned a specified distance from the Zenneck waveguide probe 122 such that the distance between adjacent ones of the metering devices 126a-e are approximately equal. As a consequence, the field measurements 173/176 (FIG. 2) taken are relatively evenly spaced with some inaccuracy due to the fact that the specific placement of the metering devices 126a-e may vary somewhat due to terrain, structures, or other obstacles.

Figure 3B:
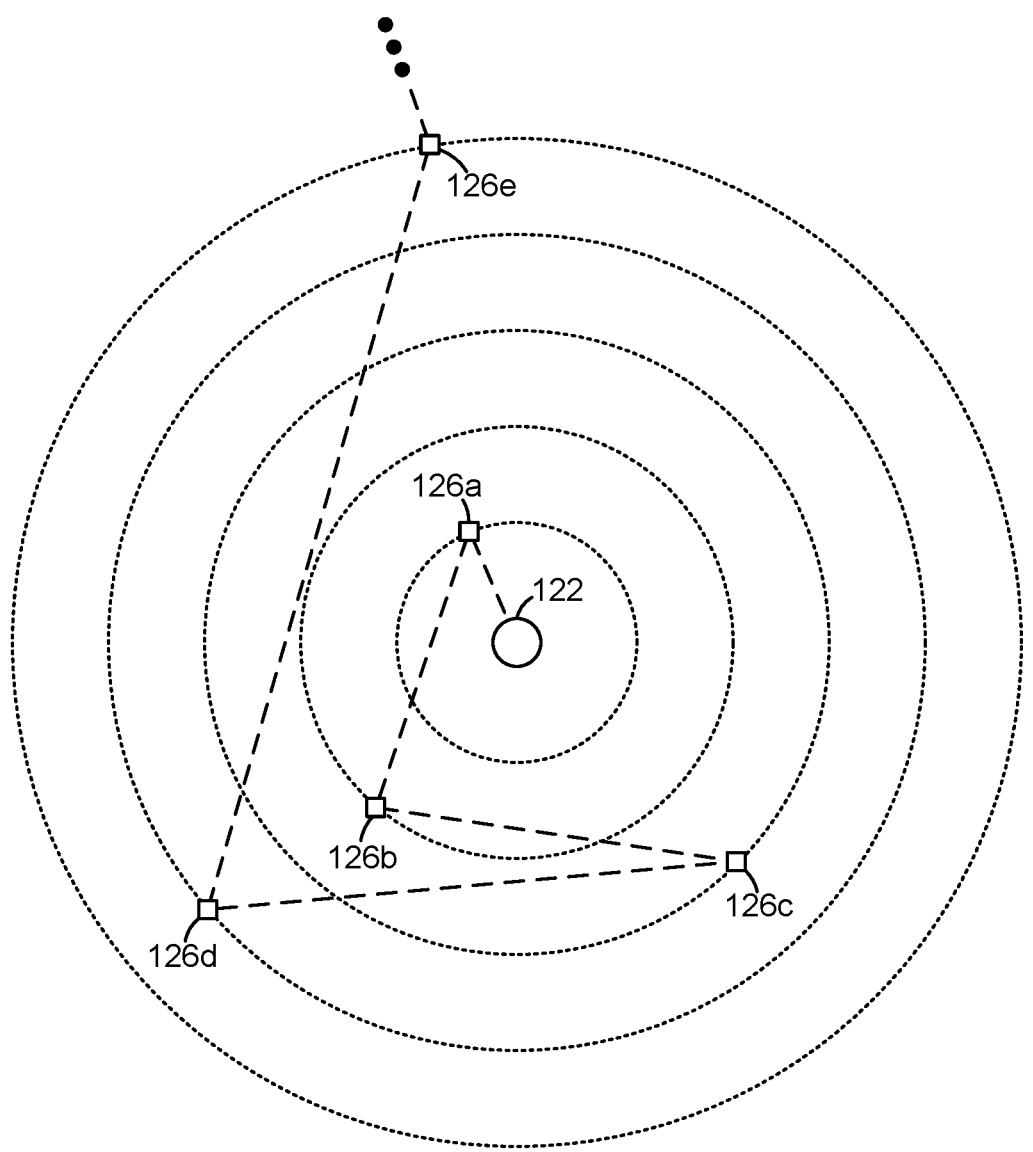

With reference to FIG. 3B, shown is another example placement of the metering devices 126a-e in which the metering devices 126a-e are positioned such that a space between the metering devices 126a-e are next closest to or next further away from the Zenneck waveguide probe 122 is approximately equal. However, the metering devices 126a-e depicted in FIG. 3B are not positioned along a defined corridor 203 (FIG. 3A). To this end, the field measurements 173/176 are generally evenly spaced when depicted on the user interface 156 even though their placement in terms of degrees around the Zenneck waveguide probe 122 is random.

Figure 3C:
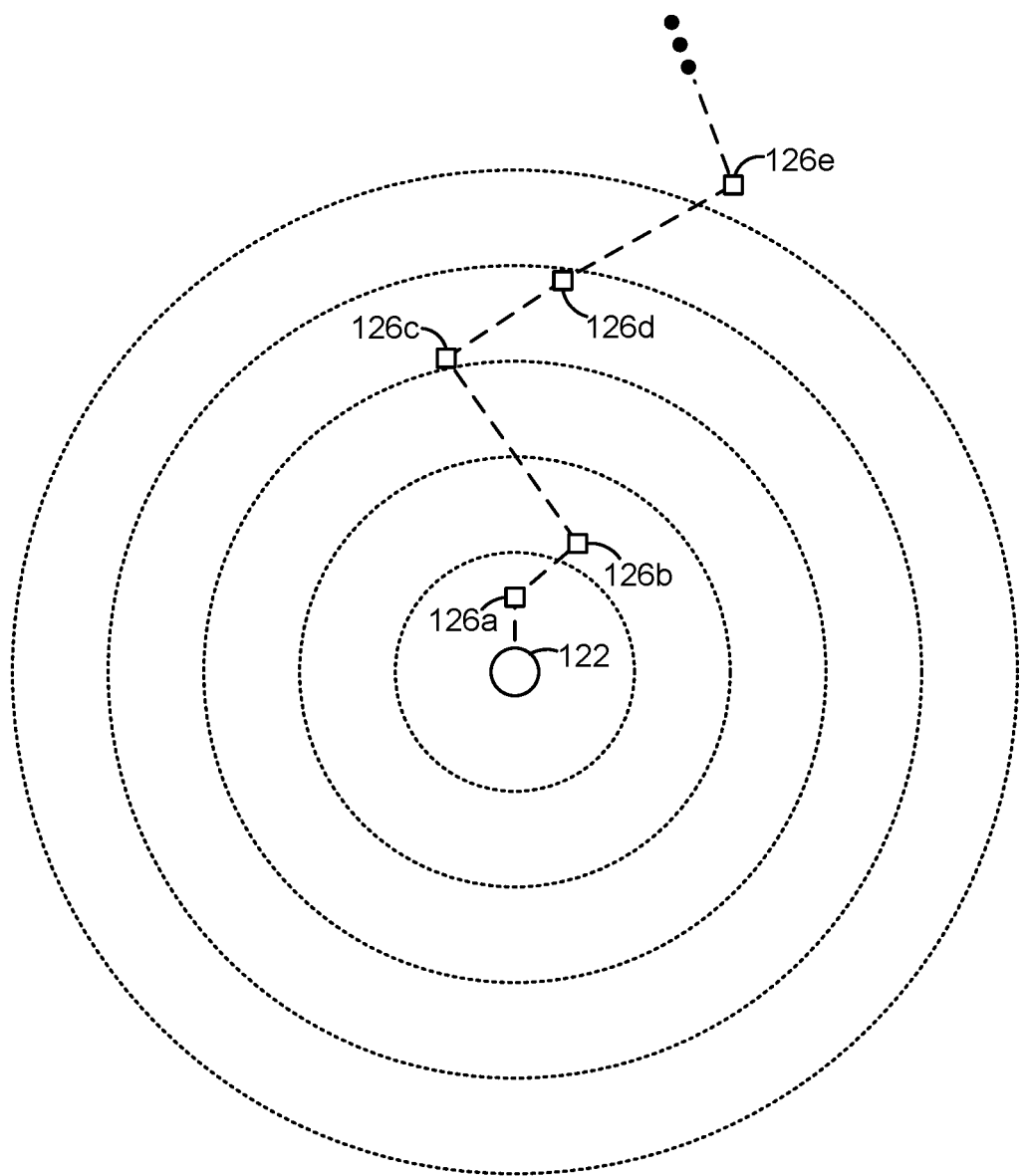

With reference to FIG. 3C, shown is another example of placement of the metering devices 126a-e. As shown, the metering devices 126a-e may be positioned in random locations relative to the Zenneck waveguide probe 122 and relative to each other.

With reference to FIGS. 3A, 3B, and 3C, the placement of each of the metering devices 126a-N may take into account the makeup of the ground at each placement site. For example, it may be desirable to place the metering devices 126a-N along a general radial line in the corridor 203 as was described above with respect to FIG. 3A provided that the ground within the corridor 203 has a uniform physical makeup and the specific parameters of such ground such as, for example, the conductivity ($\sigma$) and permittivity ($\varepsilon$) of the ground. The conductivity ($\sigma$) and permittivity ($\varepsilon$) can affect that nature of a Zenneck surface wave 123 (FIG. 2). As such, in one embodiment it would be desirable to position each of the metering devices 126a-N in locations or sites that are generally uniform in nature and have similar conductivity ($\sigma$) and permittivity ($\varepsilon$) such that the measurements taken at such sites may need minimal normalization before plotting on a graph. In some situations, measurements taken using metering devices 126a-N at various positions or sites within a corridor 203 may provide for greater accuracy assuming that the ground or lossy conducting medium at each of such positions or sites have a conductivity ($\sigma$) and permittivity ($\varepsilon$) that are similar or that at least fall within a predefined conductivity ($\sigma$) and permittivity ($\varepsilon$) tolerance. Alternatively, the placement of the metering devices 126a-N as described in any one of FIGS. 3A, 3B, or 3C may be specified such that each of the sites have a conductivity ($\sigma$) and permittivity ($\varepsilon$) that are similar or that at least fall within a predefined conductivity ($\sigma$) and permittivity ($\varepsilon$) tolerance. In addition, it may be desirable that the metering devices 126a-N are positioned such that the ground is uniform without man-made or natural structures nearby that might cause the fields of the Zenneck surface waves 123 to be altered, thereby impacting the accuracy of the measurements taken.

Figure 4:
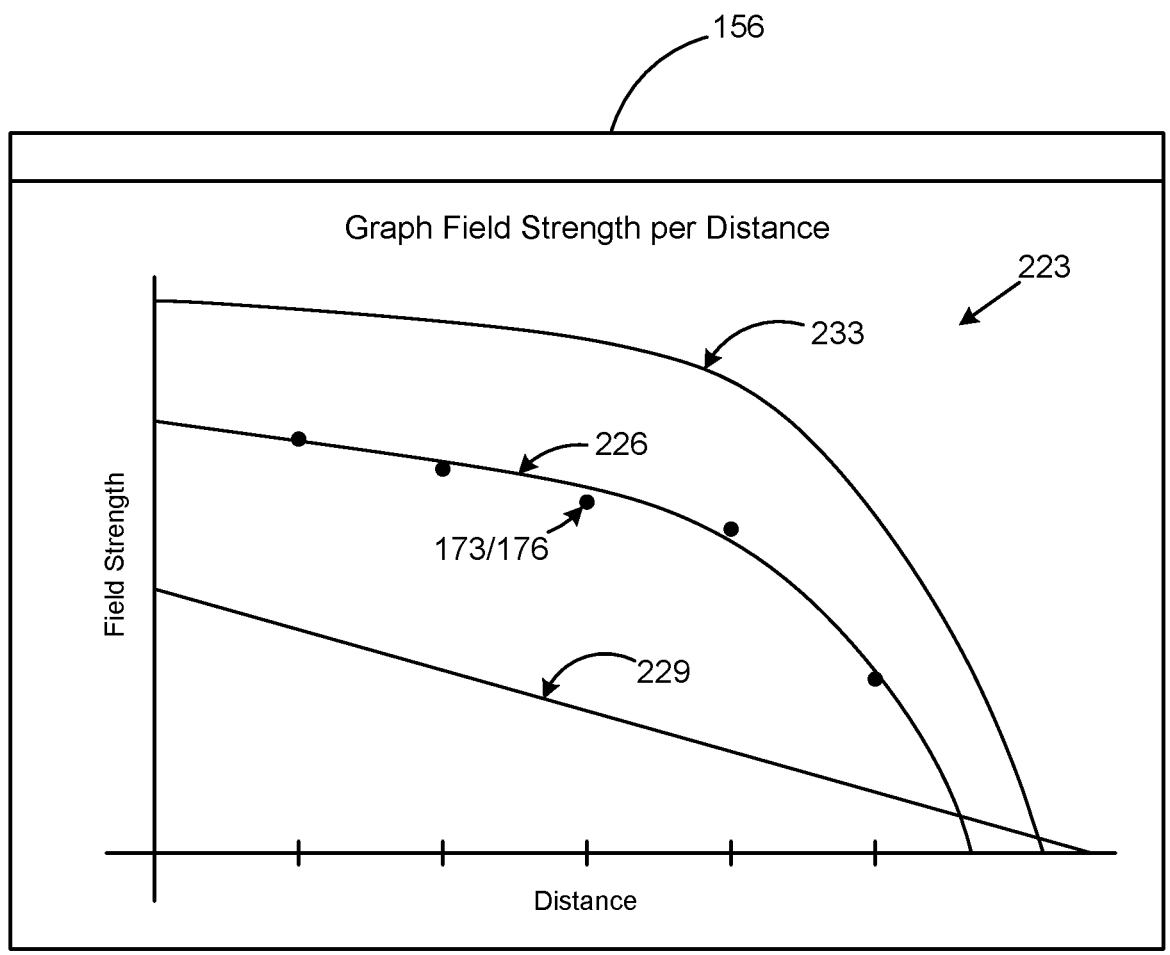
FIG. 4 is a drawing of one example of a graphical user interface generated by a computing device in the transmission measurement system of FIG. 2 according to various embodiments of the present disclosure.

With reference to FIG. 4, shown is a depiction of an example of the user interface 156 according to various aspects. The user interface 156 depicts a graph 223 of field strengths over distance as mentioned above. In particular, various magnetic or electric field measurements 173/176 may be plotted in a graph 223 of the user interface 156. According to one embodiment, as the central meter controller 143 (FIG. 2) saves records 159 (FIG. 2) that include the magnetic and/or electric field measurements 173/176, the portion of the central meter controller 143 that generates the user interface 156 obtains the latest field measurements 173/176 from the latest filed records 159 in the data store 146 (FIG. 2) for each of the metering devices 126a-N (FIG. 2).

In addition, the central meter controller 143 uses curve fitting techniques to calculate a near real time curve 226 that represents the real time transmission of electromagnetic fields by the Zenneck waveguide probe 122 (FIG. 2). The near real time curve 226 is included in graph 223 of the user interface 156. While the term "near real time" is used herein, it is understood that there will be a delay of a very short period of time after the field measurements 173/176 are generated to communicate the records 159 from the metering devices 126a-N and to access such field measurements 173/176 from the data store 146 and generate the real time curve 226. However, given that this delay is relatively small, the curve is considered to be generated in near real time.

Thus, the actual field measurements 173/176 may be depicted and the near real time curve 226 is calculated based on such actual field measurements 173/176. In order to determine whether a Zenneck surface waveguide probe 122 (FIG. 2) is launching a Zenneck surface wave 123 (FIG. 2) or simply radiation, or some combination of both, the user interface 156 depicts the view of such transmission over distance. As was discussed above with reference to FIG. 1, a Zenneck surface wave 123 should appear as a decaying exponential curve with a characteristic knee whereas the field strength of a radiation field should exhibit a curve that is more linear in nature. Accordingly, the user interface 156 provides near real time feedback as to the nature of the electromagnetic transmission of the Zenneck waveguide probe 122. Specifically, one may diagnose problems in transmission based on the nature of the ultimate near real time curve 226 that appears in the user interface 156.

In addition, the central meter controller 143 may also generate equivalent curves that facilitate comparison with the near real time curve 226 that is representative of the Zenneck surface wave 123 transmitted by the Zenneck waveguide probe 122. For example, an equivalent radiation curve 229 is calculated and included in the graph 223 that represents what the electromagnetic fields would look like if one were transmitting the same amount of power applied to the Zenneck waveguide probe 122 using an antenna structure that has the same electrical height as the Zenneck waveguide probe 122. Also, a maximum efficiency curve 233 is calculated and included in the graph 223 that represents the transmission of a Zenneck surface wave 123 using the Zenneck waveguide probe 122 with 100% efficiency at the level of power used in a given test of the Zenneck waveguide probe 122. Such a curve can be compared with the real time curve generated from the transmission of an actual Zenneck surface wave 123 to ascertain the effectiveness and efficiency of the transmission.

Figure 5A:
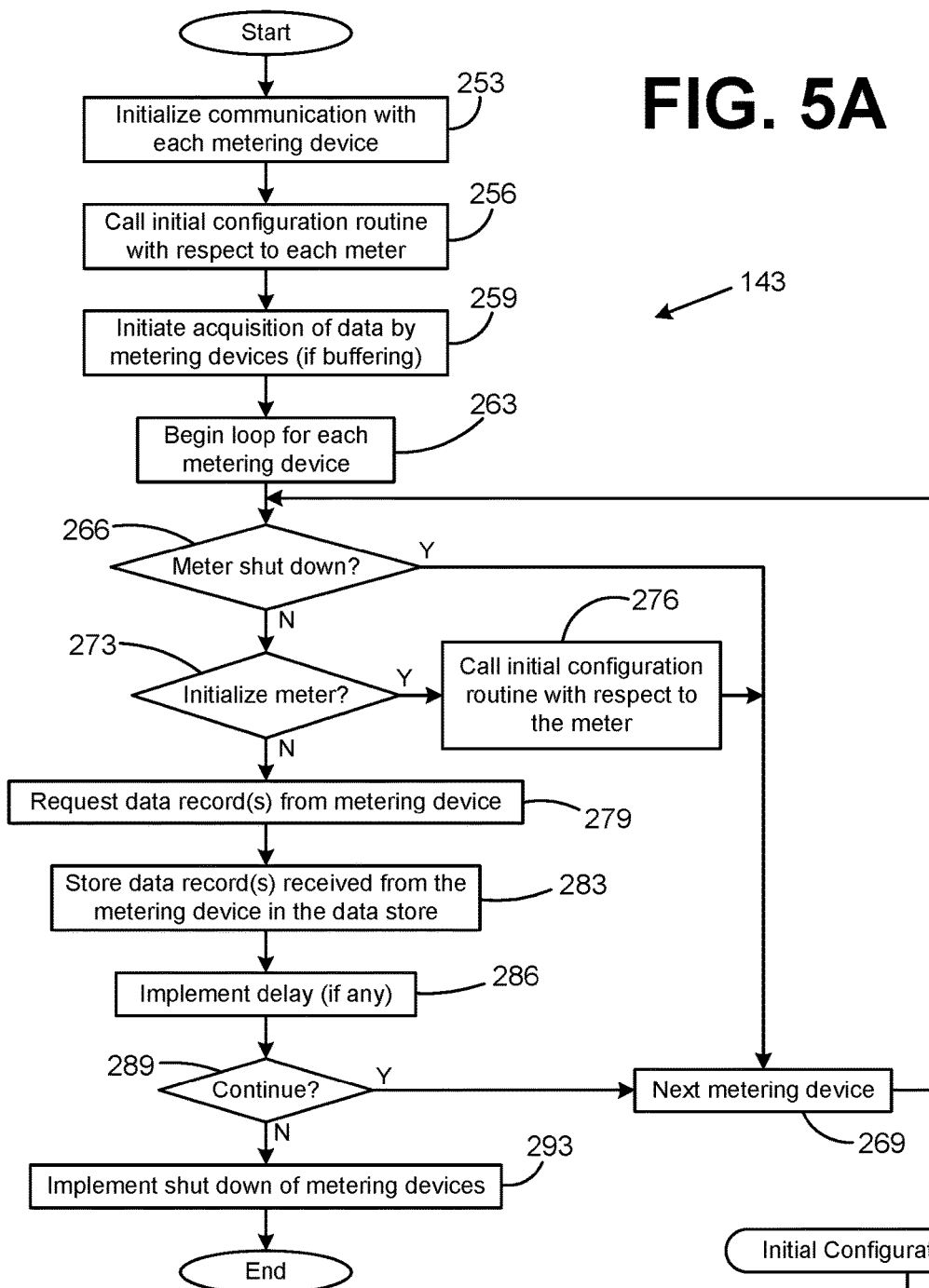
FIGS. 5A and 5B illustrate examples of flowcharts of certain functionality implemented by portions of a central meter controller executed in a computing environment in the transmission measurement system of FIG. 2 according to various embodiments of the present disclosure.

Referring next to FIG. 5A, shown is a flowchart that provides one example of the operation of a portion of the central meter controller 143 according to various embodiments. It is understood that the flowchart of FIG. 5A provides merely an example of the many different types of functional arrangements that may be employed to implement the operation of the portion of the central meter controller 143 as described herein. As an alternative, the flowchart of FIG. 5A may be viewed as depicting an example of steps of a method implemented in the computing environment 127 (FIG. 2) according to one or more embodiments.

Beginning with box 253, first the central meter controller 143 initializes communication with each metering device 126a-N (FIG. 2). This step is performed, for example, to make sure that the respective metering devices 126a-N are in an active state and ready to operate. For example, various metering devices 126a-N may be shut down or lack power.

Once the central meter controller 143 has heard from all or at least an acceptable number of the respective metering devices 126a-N to facilitate operation, the central meter controller 143 proceeds to box 256 where an initial configuration routine is called with respect to each of the metering devices 126a-N. This initial configuration routine places each metering device 126a-N in a state that facilitates the taking of field measurements 173/176 (FIG. 2) in accordance with the various aspects of the present disclosure. Once the initial configuration routine is executed with respect to each metering device 126a-N and the respective metering devices 126a-N are properly configured to take field measurements 173/176 and generate and send the records 159 (FIG. 2) to the central meter controller 143, the central meter controller 143 proceeds to box 259.

In box 259, the central meter controller 143 initiates the acquisition of the field measurements 173/176 by the metering devices 126a-N if the records 159 are initially buffered within the metering devices 126a-N themselves. This assumes that each metering device 126a-N is capable of generating records 159 that include field measurements 173/176 and storing the same in local buffers associated with the respective metering devices 126a-N. In some embodiments, the metering devices 126a-N do not include a local buffer and records 159 are not stored temporarily in the metering devices 126a-N themselves. In such case, box 259 may be skipped or may not exist within the operation of the central meter controller 143. Assuming that the metering devices 126a-N do include the capability of storing records 159 in a local buffer, then the central meter controller 143 causes the metering devices 126a-N to initiate the functionality of generating field measurements 173/176 and records 159 and storing them in their respective local buffers to be accessed and downloaded by the central meter controller 143 periodically as will be described. Thereafter, the central meter controller 143 proceeds to box 263.

Next in box 263, the central meter controller 143 begins a loop for each of the metering devices 126a-N. The central meter controller 143 proceeds to box 266 in which it is determined whether a respective one of the metering devices 126a-N is currently shut down. This is done because the metering devices 126a-N may be configured to shut down periodically and restart to avoid long term overheating and other potential problems due to long-term operation. If the respective metering device 126a-N under consideration is currently shut down, then the central metering controller 143 proceeds to box 269 in which the next metering device 126a-N is identified for consideration in the loop. Thereafter, the central meter controller 143 reverts back to box 266 as shown.

Referring back to box 266, if the central meter controller 143 determines that the current metering device 126a-N is not shut down, then the central meter controller 143 proceeds to box 273.

In box 273, the central meter controller 143 determines whether the current metering device 126a-N under consideration has been initialized for operation. If not, then the central meter controller 143 proceeds to box 276. Otherwise, the central meter controller 143 proceeds to box 279.

In box 276, the central meter controller 143 calls an initial configuration routine with respect to the current metering device 126a-N under consideration in order to configure such metering device 126a-N for operation. Thereafter, the central meter controller 143 proceeds to box 269. However, assuming that the current metering device 126a-N has been previously initialized, then the central meter controller 143 proceeds to box 279.

In box 279, the central meter controller 143 requests one or more data records 159 from the currently designated metering device 126a-N. In the case that the metering device 126a-N is configured to store records 159 in a local data buffer, then the central meter controller 143 may request and receive all of the currently stored records 159 in the data buffer of the respective metering device 126a-N. In the case that the respective metering device 126a-N does not actually store the records 159 in a local data buffer, in box 279 the central meter controller 143 sends a request to the respective metering device 126a-N to obtain a field measurement 173/176 and send the same back to the central meter controller 143 in the form of a record 159 that includes all other data as described above. Thereafter, the central meter controller 143 proceeds to box 283.

In box 283, the central meter controller 143 stores one or more data records 159 received from the respective one of the metering devices 126a-N in the data store 146 (FIG. 2). The field measurements 173/176 included within such records 159 are then available to be accessed from in the data store 146 by the central meter controller 143 to generate the user interface 156 as mentioned above. To ensure that the near real time curve 233 is as up-to-date as possible, it may be desirable to download the records 159 from the respective metering devices 126a-N as frequently as possible with relatively low data communication latency. As such, it may be desirable to avoid significant storage of records 159 in local data buffers in the metering devices 126a-N in cases where the metering devices 126a-N include local buffering capability for the temporary storage of data records 159.

Next, in box 286, a delay may be implemented in situations where it is desirable. Such circumstances may exist, for example, when a number of metering devices 126a-N are currently being initialized or other circumstances may warrant a delay in the loop. In another example, it may be the case that it is desirable that a certain number of records 159 are stored in a data buffer in the respective metering devices 126a-N before such records 159 are downloaded to the data store 146 by the central metering controller 143.

Thereafter, the central meter controller 143 proceeds to box 289. In box 289, the central meter controller 143 determines whether the current data acquisition loop is to continue or whether the data acquisition by the metering devices 126a-N is to end. The determination as to whether the loop is to continue may depend upon an appropriate operator input that indicates that the data acquisition by the metering devices 126a-N is to cease. Such might be the case, for example, when a test of a respective Zenneck waveguide probe 122 has completed or the data acquisition may be stopped for some other reason.

If the central meter controller 143 determines that the data acquisition loop is to cease in box 289, then the central meter controller 143 proceeds to box 293. Otherwise, the central meter controller 143 moves to box 269 where the next metering device 126a-N is designated. Thereafter, the central meter controller 143 reverts back to box 266 as was noted above.

In box 293, the central meter controller 143 implements a shutdown of the metering devices 126a-N. This may be done by issuing a command to the metering device is 126a-N that they are to alter their states to a standby or powered down state. Such stand by or powered down state may involve powering down all unessential components with the exception of those subsystems or components that will allow the metering devices 126a-N to be communicated with in the future in order to perform additional data acquisition in terms of obtaining field measurements 173/176 and other information to generate the records 159 for tests of future versions of Zenneck waveguide probes 122.

Thereafter, the operation of this portion of the central meter controller 143 ends as shown.

Figure 5B:
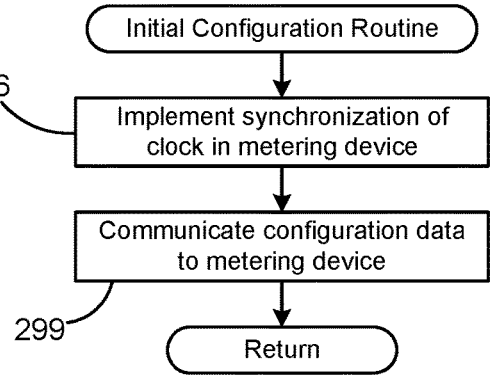

Referring next to FIG. 5B, shown is a flowchart that provides one example of the operation of another portion of the central meter controller 143 comprising the initial configuration routine that is implemented in order to initialize the operation of the metering devices 126a-N (FIG. 2) according to various embodiments. It is understood that the flowchart of FIG. 5B provides merely an example of the many different types of functional arrangements that may be employed to implement the operation of the portion of the central meter controller 143 as described herein. As an alternative, the flowchart of FIG. 5B may be viewed as depicting an example of steps of a method implemented in the computing environment 127 (FIG. 2) according to one or more embodiments.

Beginning in box 296, the central meter controller 143 implements a synchronization of the clocks in all of the metering devices 126a-N. Various approaches may be used to accomplish this task. For example, in the case that the central meter controller 143 seeks to synchronize the clocks of the metering devices 126a-N with the reference clock 144 (FIG. 2) that is local to the central meter controller 143, then the central meter controller 143 may request each of the metering devices 126a-N to provide a current timestamp 169 (FIG. 2). Any time differential or time delta between the time set forth by the reference clock 144 and the timestamp 169 is then determined taking into account any data communication latency between a respective metering device 126a-N and the computing environment 127. Thereafter, the central meter controller 143 sends a message to the respective metering device 126a-N that directs the respective metering device 126a-N to alter its local clock based upon the time delta calculated.

As an additional alternative, the central meter controller 143 may send a message to each of the metering devices 126a-N to take action to synchronize their local clocks with an external reference clock 199 (FIG. 2) to which the reference clock 144 local to the central meter controller 143 is also synchronized. In addition, there may be other approaches used to synchronize the clocks in each of the metering devices 126a-N with the reference clock 144 as can be appreciated. In addition, the central meter controller 143 may periodically synchronize the reference clock 144 with an external reference clock 199 such as an atomic clock that is available over the Internet or other reference clock as can be appreciated.

Once the respective clocks in the computing environment 127 and the metering devices 126a-N are synchronized in box 296, the central meter controller 143 proceeds to box 299 to communicate the configuration data 196 (FIG. 2) to the respective metering devices 126a-N so that they may be configured for operation in acquiring field measurements 173/176 (FIG. 2) and generating respective data records 159 (FIG. 2) that include such field measurements 173/176. Once each of the metering devices 126a-N have confirmed that they are properly configured for operation, the initial configuration routine of the central meter controller 143 ends and the operation of the central meter controller 143 reverts back to box 256 discussed above.

Figure 6:
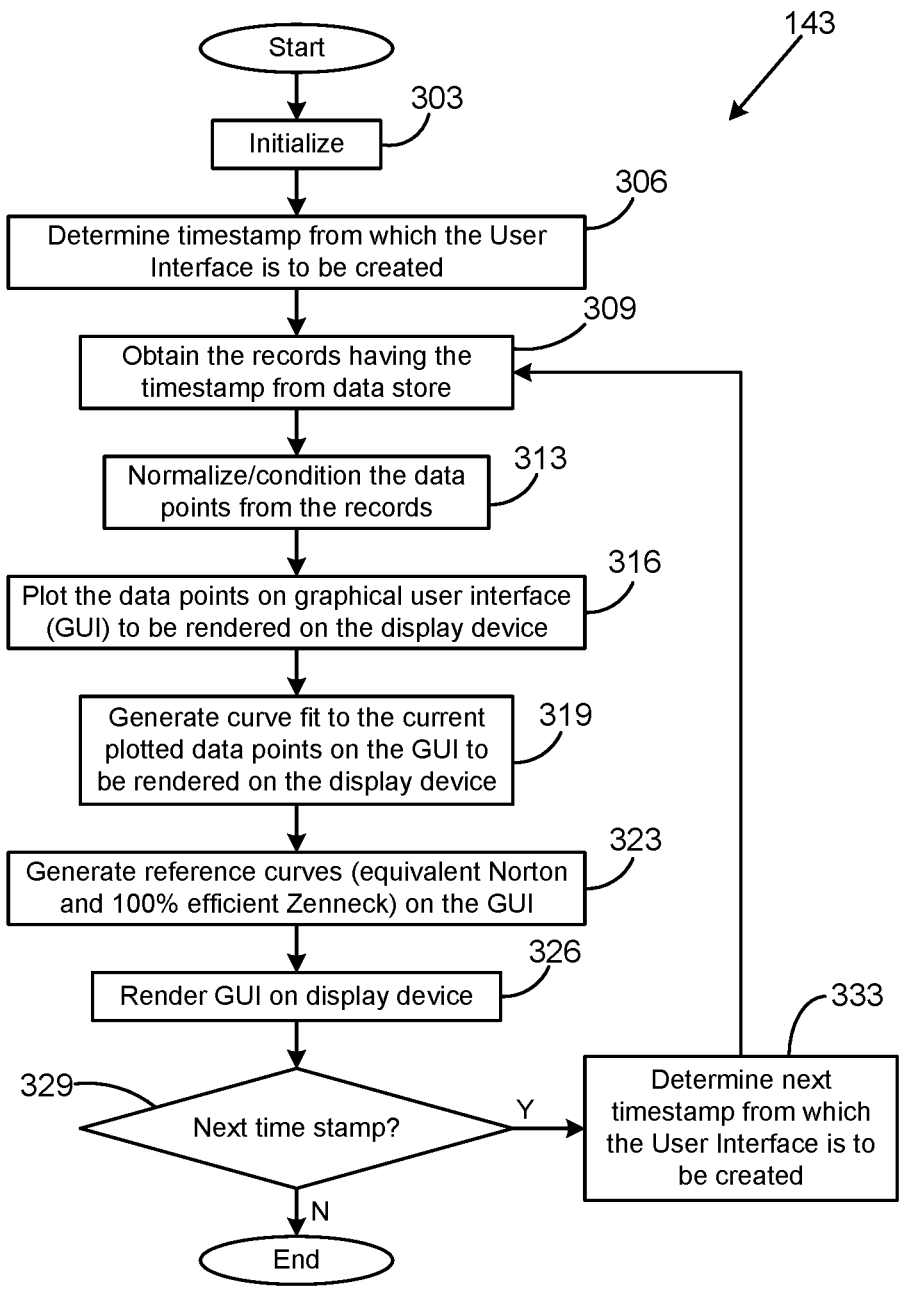
FIG. 6 illustrates another example of a flowchart of certain functionality implemented by another portion of the central meter controller executed in the computing environment in the transmission measurement system of FIG. 2 according to various embodiments of the present disclosure.

Referring next to FIG. 6, shown is a flow chart that provides an example of the operation of another portion of the central meter controller 143 in generating the user interface 156 (FIG. 2). It is understood that the flowchart of FIG. 6 provides merely an example of the many different types of functional arrangements that may be employed to implement the operation of the portion of the central meter controller 143 as described herein. As an alternative, the flowchart of FIG. 6 may be viewed as depicting an example of steps of a method implemented in the computing environment 127 (FIG. 2) according to one or more embodiments.

Beginning with box 303, the central meter controller 143 initializes operation with respect to generating the graphical user interface 156. In box 306, the central meter controller 143 determines a timestamp 169 that provides a time at which readings of a given transmitted signal were measured by the metering devices 126a-N and are included in the records 159 stored in the data store 146, where the user interface 156 is generated from such readings. In one embodiment, when determining the timestamp 169, the central meter controller 143 may simply identify the latest timestamp 169 within the records 159 such that the user interface 156 is generated from the data generated by the most recent attempt to launch a Zenneck surface wave 123. Alternatively, a user may enter a reference time of interest and the central meter controller 143 may then proceed to identify the timestamp 169 within the records 159 that is closest to the reference time. To this end, the desired field measurements 173/176 may not be the latest field measurements that are taken if the operator wishes to review the field strength per distance that occurred during a previous test in the past. Alternatively, there may be other approaches used to identify the specific timestamp 169 within the records 159 that points to the specific records 159 from which data is used to generate the user interface 156.

Once a given timestamp is identified, then in box 309 the central meter controller 143 obtains all of the records 159 that include such timestamp 169 from the data store 146. Alternatively, select ones of the field measurements 173/176 in records 159 that have a timestamp 169 within a predefined time tolerance of a predefined time may be used to generate the curve of field strength over distance. Alternatively, the field measurements 173/176 in records 159 that were generated by the respective metering devices 126a-N within a predefined time period are used to generate the curve of field strength over distance. In addition, other approaches may be used.

Next, in box 313, the central meter controller 143 may normalize or condition the magnetic or electric field measurements 173/176 of the currently considered records 159 based upon predefined parameters. For example, it may be the case that respective ones of the metering devices 126a-N are installed at different heights. As a result, the field measurements 173/176 obtained from such metering devices 126a-N might need to be adjusted to account for the height differences given that Zenneck surface waves 123 (FIG. 2) decay exponentially with increasing height above the terrestrial medium 124 (FIG. 2). In addition, the physical makeup of the sites where the respective metering devices 126a-N are located such as the makeup of the soil or the presence of man-made structures may affect the measurements taken and a correction factor must be applied to the field measurements 173/176 from a respective record 159. In this manner, the field measurements 173/176 may be adjusted based on a correction factor associated with the respective metering device 126a-N that generated the one or more field measurement(s) 173/176 themselves.

The central meter controller 143 then proceeds to box 316 in which the respective magnetic or electric field measurements 173/176 from the respective records 159 stored in the data store 146 are plotted as a data point on the graph 223 (FIG. 4) of the graphical user interface 156 to be rendered on the display device 149 (FIG. 2). Thereafter, in box 319, the central meter controller 143 proceeds to generate the near real time curve 226 (FIG. 4) based upon the current data points on the graphical user interface 156 that is to be rendered on the display device 149. That is to say, each time new data points are plotted in the graph 223, a new near real time curve 226 is generated based upon curve fitting techniques to update the near real time curve 226.

Next, in box 323, the central meter controller 143 proceeds to generate the reference curves in the graph 223 of the graphical user interface 156 as was mentioned above. In some environments, such reference curves may not be created at all and the functionality of box 323 may be skipped. The reference curves may include, for example, the equivalent radiation curve 229 (FIG. 4) or the maximum efficiency curve 233 mentioned above with reference to FIG. 4.

Thereafter, the central meter controller 143 proceeds to box 326 in which the current graphical user interface 156 embodied in the memory 130 of the computing environment 127 is rendered on the display device 149. If the most recent field measurements 173/176 from the most recently generated records 159 having the specified timestamp from the respective metering devices 126a-N are included in the graphical user interface 156, then the near real time curve 226 will be as close to real time as possible.

Next, in box 329, the central meter controller 143 determines whether it is to continue generating the most up-to-date graphical user interface 156 on the display device 149 by determining whether it should proceed to the next most recent timestamp 169. Specifically, it may be the case that the user only wants to see a graph of the readings from a given time without trying to depict the readings over time. Alternatively, the central meter controller 143 may be directed to create a near real time depiction of the readings from the records 159 as they are created and stored by the metering devices 126a-N. If a near real time depiction of the readings is desired, the central meter controller 143 proceeds to box 333 where the next timestamp 169 is identified for which the most recent field measurements 173/176 (or other field measurement) taken from the most recent records 159 is to be plotted on the graph 223 of the graphical user interface 156. Thereafter, the central meter controller 143 reverts back to box 309 as shown. Otherwise, the central meter controller 143 ends. The determination in box 329 as to whether to end the loop that is used to generate the graphical user interface 156 may depend upon user input that causes the display of the electromagnetic field output of the Zenneck waveguide probe 122 to stop.

Figure 7:
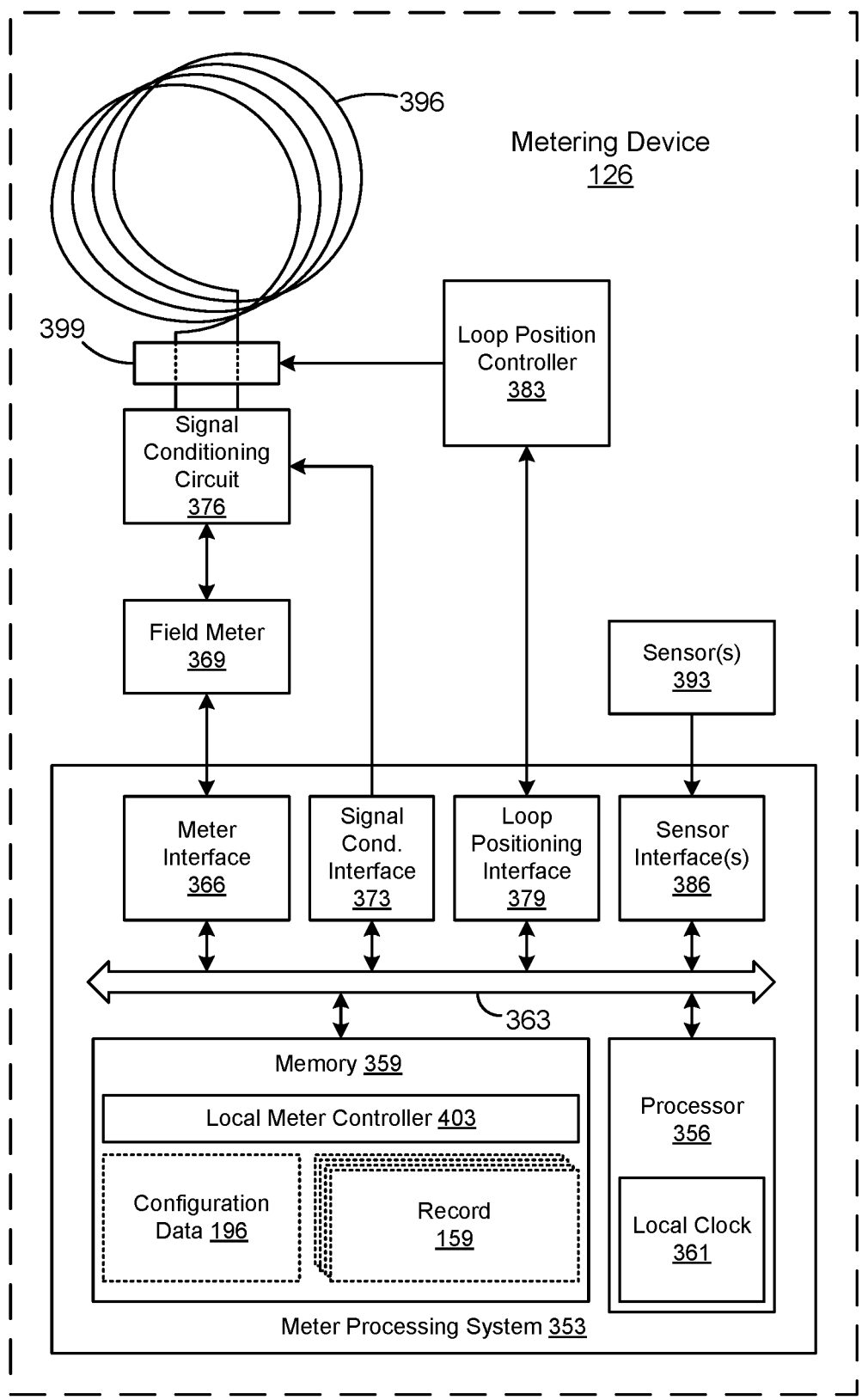
FIG. 7 is a schematic block diagram that illustrates an example of a metering device used in the transmission measurement system of FIG. 2 according to various embodiments of the present disclosure.

Turning next to FIG. 7, shown is a schematic diagram that provides one example of a metering device 126a-N, denoted herein as metering device 126, according to various embodiments of the present disclosure. The metering device 126 includes a meter processing system 353 having a processor circuit that includes a processor 356 and a memory 359, both of which are coupled to a local interface 363. To this end, the meter processing system 353 may comprise, for example, one or more computing devices such as programmable logic controllers or other computing devices. The local interface 363 may comprise, for example, a data bus with an accompanying address/control bus or other bus structure as can be appreciated.

Stored in the memory 359 are both data and several components that are executable by the processor 356. In particular, stored in the memory 359 and executable by the processor 356 is the local meter controller 403, and potentially other applications. Also, within the processor 356 is a local clock 361 from which timestamps 169 (FIG. 2) may be generated as described above. Alternatively, the local clock 361 may reside in the memory 359 and is executable by the processor 356. In addition, an operating system may be stored in the memory 359 and executable by the processor 356.

It is understood that there may be other applications that are stored in the memory 359 and are executable by the processors 356 as can be appreciated. Where any component discussed herein is implemented in the form of software, any one of a number of programming languages may be employed such as, for example, C, C++, C#, Objective C, Java, Javascript, Perl, PHP, Visual Basic, Python, Ruby, Delphi, Flash, or other programming languages.

The local meter controller 403 is stored in the memory 359 and is executable by the processor 356. In this respect, the term "executable" means a program file that is in a form that can ultimately be run by the processor 356. Examples of executable programs may be a compiled program that can be translated into machine code in a format that can be loaded into a random access portion of the memory 359 and run by the processor 356, source code that may be expressed in proper format such as object code that is capable of being loaded into a random access portion of the memory 359 and executed by the processor 356, or source code that may be interpreted by another executable program to generate instructions in a random access portion of the memory 359 to be executed by the processor 356, etc. An executable program may be stored in any portion or component of the memory 359 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 359 is defined herein as including both volatile and nonvolatile memory and data storage components. Volatile components are those that do not retain data values upon loss of power. Nonvolatile components are those that retain data upon a loss of power. Thus, the memory 359 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 356 may represent multiple processors 356 and the memory 359 may represent multiple memories 359 that operate in parallel processing circuits, respectively. In such a case, the local interface 363 may be an appropriate network that facilitates communication between any two of the multiple processors 356, between any processor 356 and any of the memories 359, or between any two of the memories 359, etc. The local interface 363 may comprise additional systems designed to coordinate this communication, including, for example, performing load balancing. The processor 356 may be of electrical or of some other available construction.

The meter processing system 353 further includes various interfaces that are each coupled to the local interface 363. Such interfaces may comprise digital or analog input or output interfaces, or input/output (I/O) interfaces. For example, the meter processing system 353 includes a meter interface 366 that facilitates data communication between the processor circuit and a field meter 369. The field meter 369 is employed to generate field measurements 173/176 (FIG. 2) as will be described.

The meter processing system 353 further includes a signal conditioning interface 373 that is coupled to, and facilitates communication with and the configuration of, a signal conditioning circuit 376. The operation of the signal conditioning circuit 376 will be described with reference to later figures. The meter processing system 353 also includes a loop positioning interface 379 that is coupled to a loop position controller 383. The loop positioning interface 379 facilitates communication between the meter processing system 353 and the loop position controller 383. The loop position controller 383 is employed to position a loop antenna or some other type of antenna in accordance with the present disclosure.

The meter processing system 353 further includes one or more sensor interfaces 386 that are coupled to one or more sensors 393. The sensor interface 386 may comprise an analog input/output or a digital input/output depending on the type of sensor 393 that is coupled thereto. The sensors 393 may comprise, for example, various different sensors that may all be part of the metering device 126. Such sensors 393 may comprise temperature sensors, humidity sensors, or other types of sensors as will be described.

The metering device 126 includes a passive multi-loop antenna 396. The passive multi-loop antenna 396 comprises a coil structure that may be encased in a large hoop as can be appreciated. The multiple turns of the passive multi-loop antenna 396 provide for greater signal output than would a passive loop antenna with a single turn or less turns than the passive multi-loop antenna 396. According to one embodiment of the present disclosure, the passive multi-loop antenna 396 includes 8 loops, although more or less loops may be employed to serve the purpose of the passive multi-loop antenna 396 as part of the metering device 126. The terminals of the passive multi-loop antenna 396 are coupled to the signal conditioning circuit 376. The output of the signal conditioning circuit 376 is applied to an input of the field meter 369.

The metering device 126 further includes an antenna position actuator 399. The loop position controller 383 generates a position signal that is applied to the antenna position actuator 399 to cause the passive multi-loop antenna 396 to move to a desired position. To this end, the antenna position actuator 399 receives signals from the loop position controller 383 that cause it to move the passive multi-loop antenna 396 to a desired position. In addition, the antenna position actuator 399 provides a feedback signal to the loop position controller 383 to indicate its actual position. In this manner, the loop position controller 383 can know that the passive multi-loop antenna 396 is positioned correctly relative to a desired position so as to acquire accurate field measurements 173/176 of electromagnetic fields transmitted by the Zenneck waveguide probe 122 (FIG. 2). The antenna position actuator 399 may include various actuators such as stepper motors or other types of motors, gear systems, position sensors, and other components in order to facilitate movement of the passive multi-loop antenna 396 and provide feedback as to the current position of the same to the loop position controller 383. According to one embodiment, the passive multi-loop antenna 396 may be spun around a given axis by the antenna position actuator 399 as can be appreciated. The antenna position actuator 399 working in conjunction with the loop position controller 383 may position the passive multi-loop antenna 396 according to a desired positioning tolerance. For example, the antenna position actuator 399 may move the passive multi-loop antenna 396 to a position within one half (½) of a degree or other tolerance, where movement is facilitated to 360 degrees about an axis. The positioning tolerance of the passive multi-loop antenna 396 is specified to ensure that the field measurements 173/176 are accurate within a desired tolerance.

Note that the antenna position actuator 399 includes a compass or other directional system to act as a reference direction from which the actual positioning of the passive multi-loop antenna 396 is determined.

The local meter controller 403 is executed by the processor 356 in order to implement the functions of the metering device 126 as will be described. In addition, various data resides in the memory 359. Such data may include, for example, the configuration data 196 and the records 159. Other executable systems may be stored on the memory 359 as is needed for the proper operation of the meter processing system 353 such as, for example, an operating system or other executable system. In addition, other data may be stored in the memory 359 in association with the operation of the local meter controller 403 as can be appreciated.

If the records 159 are stored in the memory 359, then the metering device 126 includes buffering capability as described above, where the memory 359 acts as the buffer memory. The configuration data 196 is used to configure the operation of the metering device 126 as was described.

Given the foregoing description of the metering device 126, next a general description of the operation of the same is set forth. The local meter controller 403 communicates with the central meter controller 143 (FIG. 2) in order to synchronize the local clock 361 with the reference clock 144 (FIG. 2) and to obtain the configuration data 196 that is used to configure the operation of the metering device 126. The synchronization of the local clock 361 with the reference clock 144 is performed in accordance with one of the approaches described above.

The configuration data 196 may specify a number of parameters for the operation of the metering device 126. For example, the configuration data 196 may specify the operating frequency at which field measurements 173/176 are to be taken. Also, nature of a field measurement traces to be taken using the field meter 369 may be specified including the low frequency, high frequency, and center frequency of the traces to be taken. Also, the number of field measurements 173/176 that are to be taken between the low and high frequencies may be specified. The configuration data 196 may further specify the desired position of the passive multi-loop antenna 396. The configuration data 196 may include other information as will be described.

Once the configuration data 196 is received, the metering device 126 is configured for operation. To this end, the field meter 369 is configured for operation by inputting the relevant parameters into the field meter 369 according to a predefined communications protocol of the field meter 369. The range of frequencies that can be sensed by the metering device 126 is specified by the field meter 369. According to one embodiment of the present disclosure, the field meter 369 is configured to generate field measurements 173/176 at frequencies from approximately 6 Kilohertz to 120 Kilohertz, for example, although other frequency ranges may be specified.

Alternatively, other ranges may be specified. In one embodiment, the field meter 369 is configured to generate field measurements 173/176 at or below 50 Kilohertz.

In some embodiments, each of the field meter 369 comprises a spectrum analyzer. The field meter 369 is configured to generate electric and magnetic field measurements 173/176 on six axes. To this end, the passive multi-loop antenna 396 is representative of multiple such antennas that may be coupled to the field meter 369. In addition to loop antennas, linear antennas may also be coupled to the field meter 369 such that electric field measurements 173 may be taken in up to 6 directions. Thus, the passive multi-loop antenna 396 is representative of many antenna structures such as passive multi-loop antennas, active multi-loop antennas, linear antennas, and other types of antennas that may be employed with the field meter 369.

It should be noted that where field measurements are taken along multiple axes such as 6 total axes, the loop position controller 383 and the antenna position actuator 399 may be deemed as unnecessary and eliminated as the field measurements 173/176 taken across multiple axes will provide the directional information without the need to position the multiple antennas used.

The data configuration 196 may also include information used to specify the state of the components in the signal conditioning circuit 376 as will be described.

Once the metering device 126 has been fully configured based upon the configuration data 196 received from the central meter controller 143, the metering device 126 proceeds to take field measurements 173/176 at the direction of the central meter controller 143. When directed to do so, the metering device 126 generates magnetic and/or electric field measurements 173/176 across one or more axes. Such magnetic and/or electric field measurements 173/176 are included in a record 159 along with other information based on readings from the sensors 393 and information from other sources.

Once a record 159 is generated with the field measurement(s) 173/176, the record 159 is sent to the central meter controller 143 to be stored in the data store 146. In this manner, the metering device 126 transmits the field measurement(s) 173/176 to a remote computing device comprising the computing environment 127 through the network 133. In one embodiment, the metering device 126 generates a single record 159 with one or more field measurements 173/176 and sends the same to the central meter controller 143 executed on the computing environment 127 in response to a request from the central meter controller 143. In another embodiment, the metering device 126 automatically generates a continuous stream of field measurements 173/176 at the direction of the central meter controller 143 that are included in a corresponding number of records 159 that are stored in the memory 359 that acts as a data buffer. The metering device 126 periodically downloads the buffered records 173/176 upon request for the same by the central meter controller 143 executed on the computing environment 127.

Figure 8:
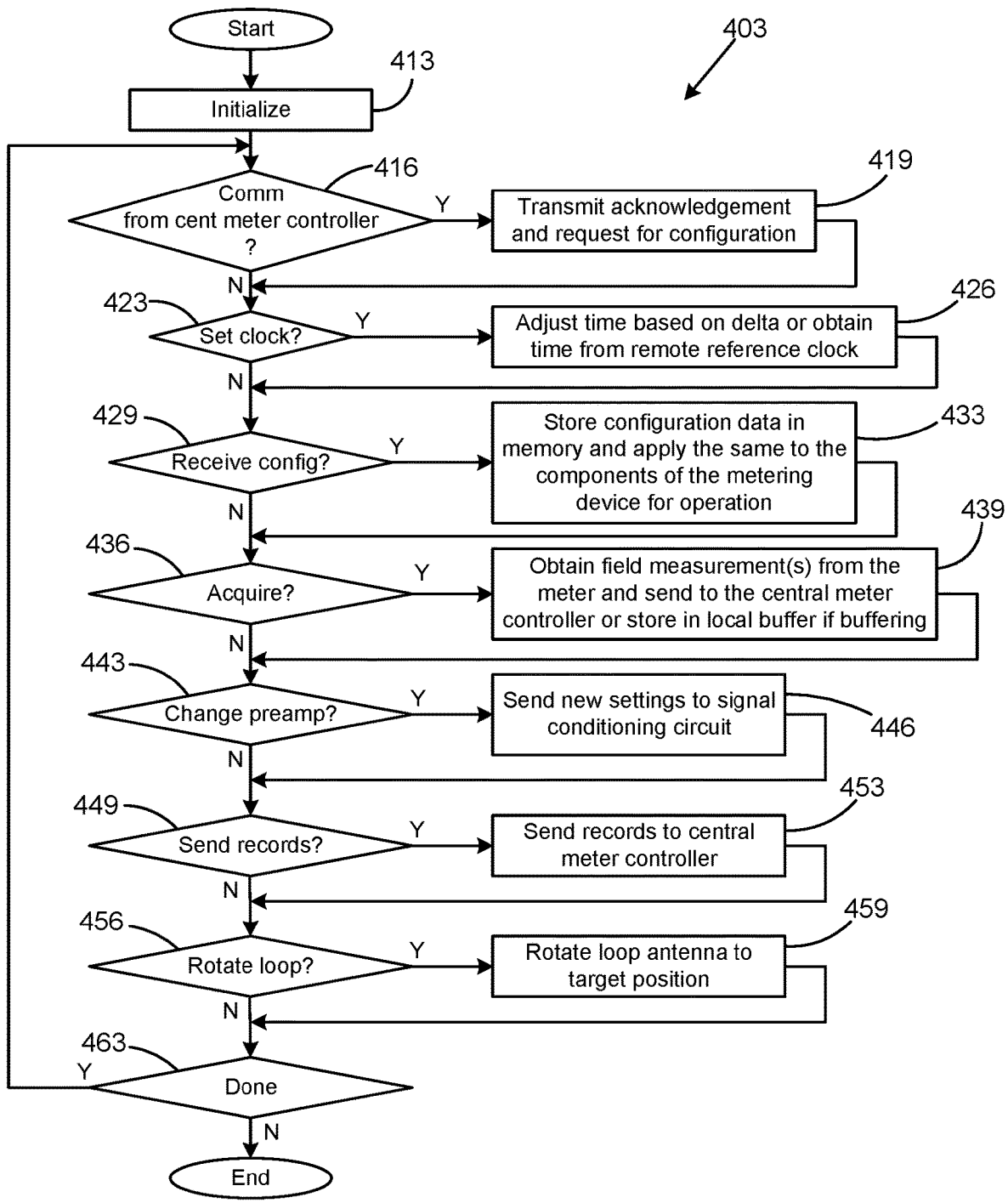
FIG. 8 illustrates another example of a flowchart of certain functionality implemented by at least a portion of local meter controller executed in the metering device of FIG. 7 according to various embodiments of the present disclosure.

Referring next to FIG. 8, shown is a flowchart that provides one example of the operation of the local meter controller 403 that controls the operation of each of the metering devices 126a-N (FIG. 2) according to various aspects of the present disclosure. It is understood that the flowchart of FIG. 8 provides merely an example of the many different types of functional arrangements that may be employed to implement the operation of the local meter controller 403 as described herein. In addition, the local meter controller 403 may include additional functionality not discussed herein. As an alternative, the flowchart of FIG. 8 may be viewed as depicting an example of steps of a method implemented in the meter processing system 353 (FIG. 7) according to various embodiments.

Beginning with box 413, the local meter controller 403 initializes its operation by setting initial parameters and other initial settings as can be appreciated. Thereafter in box 416, the local meter controller 403 determines whether it has received an initial communication from the central meter controller 143 (FIG. 2) requesting whether the metering device 126 is active and responsive. If such a communication is received from the central meter controller 143, the local meter controller 403 proceeds to box 419 to transmit an acknowledgement to the request back to the central meter controller 143. If no such request is received, then the local media controller 403 proceeds to box 423.

In box for 423, the local meter controller 403 determines whether the local clock 361 (FIG. 7) is to be adjusted. If such is the case, then the local meter controller 403 proceeds to box 426 to adjust the local clock 361 based on a delta obtained from the central meter controller 143 or from a remote reference clock 199 (FIG. 2) as was described above. In adjusting the local clock 361, the local meter controller 403 may transmit messages to the central meter controller 143 and receive messages from the same as needed to accomplish the synchronization of the local clock 361 with the reference clock 144 (FIG. 2) of the computing environment 127 (FIG. 2). If it is determined that no clock is to be adjusted in box 423, or the local clock 361 is successfully adjusted and synchronized with the reference clock 144 in box 419, then the local meter controller 403 proceeds to box 429.

In box 429, the local meter controller 403 determines whether a data configuration 196 (FIG. 2) has been received from the central meter controller 143 to be used to configure the metering device 126 for operation. If such is the case, the local meter controller 403 proceeds to box 433. Otherwise the local meter controller 403 proceeds to box 436.

In box 433, the local meter controller 403 stores the configuration data 196 in the memory 359 and applies the various parameters included in the configuration data 196 to the various components of the metering device 126 for operation. Thereafter, the local meter controller 403 proceeds to box 436.

In box 436, the local meter controller 403 determines whether it is to obtain field measurements 173/176 to be embodied in records 159 (FIG. 2). If so, the local meter controller 403 proceeds to box 439. According to one embodiment, in box 439 the local meter controller 403 obtains the field measurements 173/176 and includes the same in a record 159 along with other information as mentioned above. The record 159 is then sent to the central meter controller 143 to be stored in the data store 146. In this embodiment, the metering device 126 generates records 159 only when requested by the central meter controller 143.

Alternatively, where the local meter controller 403 includes the capability of buffering records 159 in the memory 359, upon receiving a directive from the central meter controller 143 to begin to acquire field measurements 173/176 in box 436, the local meter controller 403 proceeds to continuously take field measurements 173/176. The local meter controller 403 generates records 159 that include such field measurements 173/176 along with other information as described above. The records 159 are then stored in the memory 359 until requested by the central meter controller 143.

In any event, once the local meter controller 403 generates a corresponding record 159 as requested by the central meter controller 143 or once the local meter controller 403 initiates the continuous generation of records 159 in box 439, the local meter controller 403 proceeds to box 443.

In box 443, the local meter controller 403 determines whether the state of the components in the signal conditioning circuit 376 (FIG. 7) is to be altered. If such is the case, then the local meter controller 403 proceeds to box 446. Otherwise, the local meter controller 403 proceeds to box 449. This action reflects the fact that from time to time, the operation of the metering device 126 may need to be altered by providing more pre-amplification of the signals from the passive multi-loop antenna 396 (FIG. 7) or by changing the filtering or attenuation provided by the signal conditioning circuit 376 to improve the field measurements 173/176 obtained by the field meter 369. An initial state of the signal conditioning circuit 376 is set in box 433 based on parameters obtained in the configuration data 196 as mentioned above. According to one embodiment, the signal conditioning circuit 376 can be placed in one of three states for the operation of the amplifiers included therein. As an additional alternative, the local meter controller 403 may implement an initial configuration routine with respect to the signal conditioning circuit 376. Specifically, a signal may be transmitted from a Zenneck waveguide probe 122 (FIG. 2) and pre-amplifiers in the signal conditioning circuit 376 may be switched in or out of the circuit until an acceptable signal is input to the field meter 369. The specific circuit in the signal conditioning circuit 376 will be described with reference to later figures.

In box 446, the local meter controller 403 applies new settings to the signal conditioning circuit 376 as directed by the central meter controller 143. Thereafter, the local meter controller 403 proceeds to box 449.

In box 449, the local meter controller 403 determines whether records 159 that include various field measurements 173/176 are to be sent to the central meter controller 143. This determination may be made based upon whether a request for such records 159 has been received from the central meter controller 143. This assumes that the records 159 are buffered in the memory 359 and are continuously generated by the metering device 126. Assuming that records 159 are to be sent to the central metering controller 143, the local meter controller 403 proceeds to box 453. Otherwise, the local meter controller moves to box 456.

In box 453, the local meter controller 403 sends all records 159 that include the various field measurements 173/176 and other information as described above to the central meter controller 143. This is done while the field meter 369 continues to generate new field measurements 173/176. Thereafter, the local meter controller 403 proceeds to box 456. Note that where records are not to be buffered in the memory 359, then boxes 449 and 453 may be skipped accordingly.

Next, in box 456, the local meter controller 403 determines whether the position of the passive multi-loop antenna 396 (FIG. 7) is to be adjusted. Initially, the position of the passive multi-loop antenna 396 is set based upon a position specified in the configuration data 196 in box 433 above. An adjustment is determined to be needed in box 456 based upon the receipt of a message from the central meter controller 143 indicating that the position of the passive multi-loop antenna 396 is to be adjusted from the initial position. Assuming the position of the passive multi-loop antenna 396 is to be adjusted in box 456, the local meter controller 403 proceeds to box 459 in which the new position is provided to the loop position controller 383 (FIG. 7). The loop position controller 383 then causes the antenna position actuator 399 (FIG. 7) to adjust the position of the passive multi-loop antenna 396 to the new position accordingly. Note that in the case where a field meter 369 is used that employs multiple antennas along multiple axes, then there may be no need to position an antenna. In such case, boxes 456 and 459 may be skipped accordingly.

Assuming that the position of the passive multi-loop antenna 396 does not need to be adjusted as determined in box 456, then the local media controller 403 proceeds box 463. Also, if the position of the passive multi-loop antenna 396 is successfully adjusted in box 459, then the local meter controller 403 proceeds to box 463 as well.

In box 463, the local meter controller 403 determines whether its operation is completed based upon a message received from the central meter controller 143. The activity of the local meter controller 403 may be completed, for example, based upon an input from a user at the central meter controller 143 indicating that the operation is over. If the operation of the local meter controller 403 is completed as determined in box 463, then the operation of the local meter controller 403 ends as shown. Otherwise the local meter controller 403 reverts back to box 416.

Turning to FIG. 9, shown is a table that provides an example of the configuration data 196 that is applied to the metering devices 126a-N (FIG. 2) to configure the various components of such metering devices 126a-N for operation. The configuration data 196 is input by a user into the central meter controller 143 (FIG. 2) by manipulating various user interfaces in order to control the field measurements 173/176 and other aspects of the metering devices 126a-N.

The configuration data 196 includes a "Name of Test" field which is used to identify a specific test of a given Zenneck waveguide probe 122 (FIG. 2). The "Name of Test" field may include, for example, a frequency of operation as well as a date upon which the test occurred as well as other identifying information known to operators.

Next the configuration data 196 includes fields that specify a center frequency and a span of a field measurement trace to be obtained when field measurements 173/176 are generated. Alternatively, the field measurement trace may be specified with a center frequency along with low and high frequencies, or the field measurement trace may be specified in some other manner. The configuration data further includes a "Resolution Bandwidth" that indicates the selectivity and noise sensitivity of the field meter 369 in Hertz.

Further fields in the configuration data 196 include a reference level and units of measurement. The reference level identifies the amplitude threshold of the field meter 369. The units of measurement indicate the units of the field measurements 173/176 such as millivolts per meter (mV/m) or other units. The configuration data 196 also includes antenna position information that may be expressed as degrees from a fixed reference point such as degrees from North, where North may be determined from an electronic compass as described above. The configuration data 196 may further specify the state of various components such as amplifiers (preamps), switches, filter circuits, attenuation circuitry, and other components in the signal conditioning circuit 376 (FIG. 7). In addition, other parameters may be specified in the configuration data 196.

Figure 10:
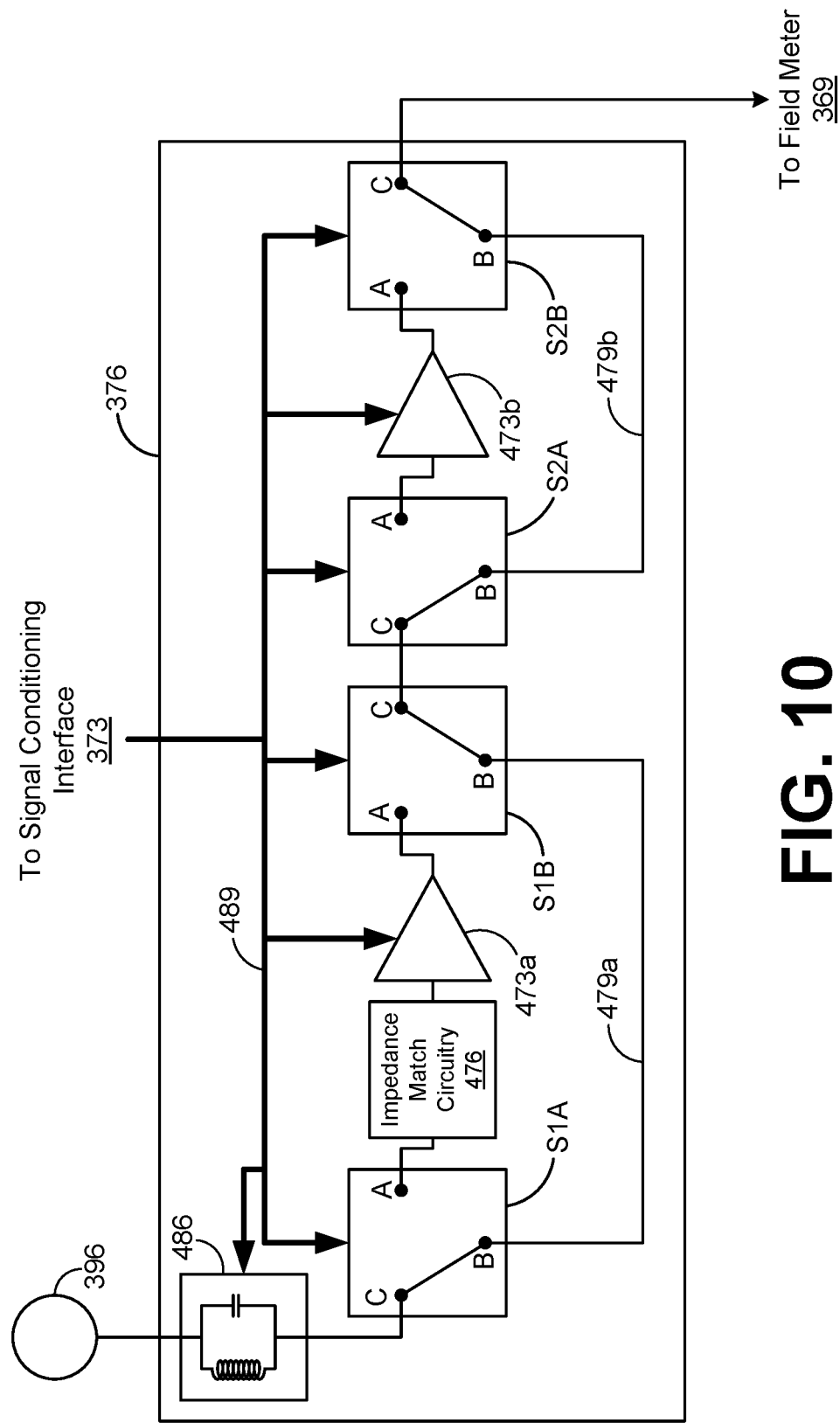
FIG. 10 is a schematic block diagram of a preamp/filter of the metering device of FIG. 7 according to various embodiments of the present disclosure.

Referring next to FIG. 10, shown is a schematic diagram that provides one example of the signal conditioning circuit 376 according to various embodiments of the present disclosure. The signal conditioning circuit 376 facilitates both the electronic filtering of signals from the passive multi-loop antenna 396 and the amplification of such signals before they are applied to the field meter 369.

The signal conditioning circuit 376 includes at least two amplifiers, denoted herein as first stage amplifier 473a and second stage amplifier 473b. The signal conditioning circuit 376 also includes four Radio Frequency (RF) switches organized into two pairs denoted herein as the RF switches S1A, S1B, S2A, and S2B. The first and second stage amplifiers 473a and 473b may comprise, for example, RF amplifiers or other types of amplifiers. In one example, the first and second stage amplifiers 473a and 473b may each comprise, for example, a wideband low noise Amplifier model HD24540 manufactured by HD Communications Corporation of Holbrook, N.Y.

The first and second stage amplifiers 473a and 473b may also be configured as active filters to reduce noise. The signal conditioning circuit 376 further includes impedance match circuitry 476 that provides for impedance matching as can be appreciated. The impedance match circuitry 476 is coupled to the signal input of the first stage amplifier 473a as will be described. The signal conditioning circuit 376 further includes a filter circuit 486 that eliminates unwanted spurious signals from the desired signal received from the passive multi-loop antenna 396 as will be described. The local meter controller 403 (FIG. 7) causes the signal conditioning interface 373 to send one or more signals to the signal conditioning circuit 376 that control the operation of the first and second stage amplifiers 473a and 473b, the RF switches S1A/S1B/S2A/S2B, the filter circuit 486, and potentially other components as will be described. In this manner, the local meter controller 403 controls the operation of the components in the signal conditioning circuit 376.

The input signal from the passive multi-loop antenna 396 is coupled to the filter circuit 486. The filter circuit 486 receives a control input from local meter controller 403 through the signal conditioning interface 373. This control input configures the operation of the filter circuit 486. For example, the filter circuit 486 may include a plurality of different low pass filters, where each low pass filter has a different cutoff frequency. In one embodiment, the control input from the signal conditioning interface 373 selects one of such low pass filters to be placed in the circuit pathway so that the desired low frequencies pass through the filter circuit 486 and high frequencies about the cutoff point are dissipated accordingly.

The filter circuit 486 may also include other types of filters such as band pass filters, notch filters, or other types of filters. Such filters may be static in nature or configurable to provide for various filtering options depending on the frequency of the transmitted signals that are to be acquired by the passive multi-loop antenna 396. The ultimate operation of the filter circuit 486 may be controlled by control signals generated by the signal conditioning interface 373 as directed by the local meter controller 403. Such control signal is applied to the filter circuit 486 to specify the desired filtering to be performed by the filter circuit 486. The signal output from the filter circuit 486 is applied to an input of the RF switch S1A as shown. Alternatively, the filter circuit 486 may not be employed at all. In such case, the signal output of the passive multi-loop antenna 396 may be applied directly to the input of the RF switch S1A.

Each of the RF switches S1A, S1B, S2A, and S2B include an A node and a B node as shown. When the RF switch S1A is in the A state, the common node C of the RF switch S1A is coupled to the A node, thereby applying the input from the passive multi-loop antenna 396 to an input of impedance match circuitry 476. The output of the impedance match circuitry 476 is coupled to a signal input of the first stage amplifier 473a. When in the B state, the common node C of the RF switch S1A is applied to node B of the RF switch S1A. In this manner, the first stage amplifier 473a is bypassed by bypass conductor 479a.

The output of the first stage amplifier 473a is applied to the A node of the RF switch S1B. When in the A state, the A node of the RF switch S1B is coupled to a common node C of the RF switch S1B. When in the B state, the B node of the RF switch S1B is coupled to the common node C of the RF switch S1B. The common node C of the RF switch S1B is coupled to a common node C of the RF switch S2A as shown.

According to one embodiment, the RF switches S1A and S1B are both placed into either the A state or the B state simultaneously. When both RF switches S1A and S1B are in the A state, the input signal from the passive multi-loop antenna 396 is applied to the impedance match circuitry 476 and the first stage amplifier 473a. When both RF switches S1A and S1B are in the B state, the input signal from the passive multi-loop antenna 396 is routed around the impedance match circuitry 476 and the first stage amplifier 473a by way of the bypass conductor 479a.

When in the A state, the common node C of the RF switch S2A is coupled to the A node of RF switch S2A which, in turn, is coupled to a signal input of the RF switch S2A. When in the B state the common node C of the RF switch S2A is coupled to the B node of RF switch S2A which, in turn, is coupled to bypass conductor 479b that facilitates bypassing the second stage amplifier 473b.

The signal output of the second stage amplifier 473b is coupled to an A node of the RF switch S2B. The bypass conductor 479b is coupled to the B node of the RF switch S2B. When in the A state, node A of the RF switch S2B is coupled to the common node C of the RF switch S2B, thereby coupling the signal output of the second stage amplifier 473b to the field meter 369 that is coupled to the common node C of the RF switch S2B. When in the B state, node B of the RF switch S2B is coupled to the common node C of the RF switch S2B, thereby coupling the bypass conductor 479b to the field meter 369 coupled to the common node C of the RF switch S2B.

According to one embodiment, the RF switches S2A and S2B are both placed into either the A state or the B state simultaneously. When both RF switches S2A and S2B are in the A state, the input signal at common node C of the RF switch S2A is applied to the second stage amplifier 473b. When both RF switches S2A and S2B are in the B state, the input signal at common node C of the RF switch S2A is routed around the second stage amplifier 473b by way of the bypass conductor 479b.

Next, a general discussion of the various states of operation of the signal conditioning circuit 376 is described. In general, the local meter controller 403 controls the state of the components of the signal conditioning circuit 376 by sending control signals thereto through a control signal bus 489 coupled to the signal conditioning interface 373.

In a first state, the signal received from the passive multi-loop antenna 396 is routed directly to the field meter 369 without amplification by either one of the first or second stage amplifiers 473a/473b. Thus, in the first state, the local meter controller 403 causes RF switches S1A and S1B associated with the first stage amplifier 473a to be placed in the B state. The RF switches S2A and S2B associated with the second stage amplifier 473b are also placed in the B state. Also, the first and second stage amplifiers 473 are disabled. In this configuration, the signal received from the passive multi-loop antenna 396 is routed through the filter circuit 486, if any, and directed to the field meter 369, thereby bypassing both of the first and second stage amplifiers 473a and 473b. In this respect, the RF switches S1A, S1B, S2A, and S2B route the signal received from the passive multi-loop antenna 396 through both bypass conductors 479a and 479b, thereby coupling the passive multi-loop antenna 396 directly to the output of the signal conditioning circuit 376 and directed to the field meter 369.

The bypass conductors 479a and 479b are labeled "bypass conductors" herein as the amplifiers 473a and 473b are bypassed accordingly. Note that in the first state, the amplifiers 473a and 473b are electrically isolated from the signal path leading from the passive multi-loop antenna 396 to the field meter 369.

In a second state, the signal received from the passive multi-loop antenna 396 is routed through the impedance match circuitry 476 and the first state amplifier 473a while bypassing the second stage amplifier 473b. In this case, the signal from the passive multi-loop antenna 396 is amplified by one of the first and second stage amplifiers 473a/473b. Thus, in the second state, the local meter controller 403 causes the RF switches S1A and S1B associated with the first stage amplifier 473a to be placed in the A state, while at the same time, causing the RF switches S2A and S2B to be placed in the B state.

In this second state, the signal from the passive multi-loop antenna 396 is routed through the filter circuit 486, if any, to an input of the impedance match circuitry 476 and the first stage amplifier 473a. The output of the first stage amplifier 473a is routed directly to the field meter 369 by way of the bypass conductor 479a. The first stage amplifier 473a is enabled and the second amplifier 473b is disabled. In this second state, the signal from the passive multi-loop antenna 396 is amplified and filtered by the first stage amplifier 473a. The amplified signal output of the first stage amplifier 473a is routed directly to the input of the field meter 369. By virtue of the fact that the RF switches S2A and S2B are in the B state, the second stage amplifier 473b is electrically isolated from the circuit.

In a third state, the signal received from the passive multi-loop antenna 396 is routed through the impedance match circuitry 476, the first state amplifier 473a, and the second stage amplifier 473b to obtain a maximum amplification and/or filtering of the signal. In the third state, the local meter controller 403 causes all of the RF switches S1A, S1B, S2A and S2B to be placed in the A state. In this third state, the signal from the passive multi-loop antenna 396 is routed through the filter circuit 486, if any, and through the impedance match circuitry 476 to the input of the first stage amplifier 473a. The output of the first stage amplifier 473a is routed through switches S1B and S2A to an input of the second stage amplifier 473b. The output of the second stage amplifier 473b is routed directly to the field meter 369. The first and second stage amplifiers 473a and 473b are both enabled. In this third state, the first and second stage amplifiers 473a and 473b are connected in series, and the signal from the passive multi-loop antenna 396 is amplified and filtered by both the first and second stage amplifiers 473a and 473b in succession. The amplified signal output of the second stage amplifier 473b is routed to the input of the field meter 369.

Thus, based on the control signals applied to the various components of the signal conditioning circuit 376, one may select the nature of the filtering of the signal from the passive multi-loop antenna 396 and whether the signal is amplified and filtered by one or both of the first and second stage amplifiers 473a and 473b. Accordingly, the signal conditioning circuit 376 can alternatively couple the first and second stage amplifiers 473a/473b, or the bypass conductors 479a/479b between the passive multi-loop antenna 396 and the field meter 369.

With respect to the foregoing, a phrase, such as "at least one of X, Y, or Z," unless specifically stated otherwise, is to be understood with the context as used in general to present that an item, term, etc., can be either X, Y, or Z, or any combination thereof (e.g., X, Y, and/or Z). Similarly, "at least one of X, Y, and Z," unless specifically stated otherwise, is to be understood to present that an item, term, etc., can be either X, Y, and Z, or any combination thereof (e.g., X, Y, and/or Z). Thus, as used herein, such phrases are not generally intended to, and should not, imply that certain embodiments require at least one of either X, Y, or Z to be present, but not, for example, one X and one Y. Further, such phrases should not imply that certain embodiments require each of at least one of X, at least one of Y, and at least one of Z to be present.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present disclosure defined in the following claims, the scope of which are to be accorded the broadest interpretation so as to encompass modifications and equivalent structures.

Therefore, at least the following is claimed:

1. A system comprising:
   a plurality of metering devices positioned along a terrestrial medium relative to a Zenneck surface waveguide probe; and
   at least one computing device configured to at least:
      configure each of the metering devices for operation at an operating frequency;
      store a plurality of field measurements from each of the plurality of metering devices, the field measurements indicating a wireless signal output of the Zenneck surface waveguide probe; and
      generate a user interface for display, the user interface indicating a field strength over distance of the wireless signal output of the Zenneck surface waveguide probe;
   wherein each of the metering devices further comprises a meter controller that generates a plurality of records, wherein each of the records includes at least one of the field measurements and a timestamp.

2. The system of claim 1, wherein the at least one computing device is further configured to adjust at least one of the field measurements based on a factor associated with a respective metering device that generated the at least one of the field measurements.

3. The system of claim 1, wherein the at least one computing device is further configured to cause the user interface to be rendered on a display device.

4. The system of claim 1, wherein the user interface indicates the field strength over distance by generating a curve from select ones of the field measurements taken from the metering devices, wherein the select ones of the field measurements were generated by the metering devices within a predefined time tolerance of a predefined time.

5. The system of claim 1, wherein the user interface indicates the field strength over distance by generating a curve from select ones of the field measurements taken from the metering devices, wherein the select ones of the field measurements were generated by the metering devices within a predefined time period.

6. The system of claim 1, wherein the meter controller obtains the timestamp from a common reference clock though a network.

7. The system of claim 1, wherein each of the metering devices includes a clock, wherein the meter controller obtains the timestamp from the clock.

8. The system of claim 7, wherein the clock is synchronized to a common reference clock.

9. The system of claim 1, wherein the field measurements further comprise a plurality of electric field measurements taken along a plurality of axes by a respective one of the metering devices, wherein the electric field measurements taken along the axes are stored in a respective one of the records.

10. The system of claim 1, wherein the field measurements further comprise a plurality of magnetic field measurements taken along a plurality of axes by a respective one of the metering devices, wherein the magnetic field measurements taken along the axes are stored in a respective one of the records.

11. The system of claim 1, wherein the field measurements further comprise a measurement of an electric field.

12. The system of claim 1, wherein the field measurements further comprise a measurement of a magnetic field.

13. The system of claim 1, wherein each of the metering devices further comprises a positioning system configured to position a passive loop antenna.

14. The system of claim 1, wherein each of the metering devices comprises an environmental sensor configured to generate a measurement of a factor associated with an environment in a vicinity of the metering device.

15. A method comprising:
   obtaining, in a computing device, a plurality of field measurements from a corresponding plurality of metering devices while transmitting a wireless signal output using a Zenneck surface waveguide probe, the field measurements indicating the wireless signal output of the Zenneck surface waveguide probe; and
   generating a user interface for display using the field measurements, the user interface indicating a field strength over distance of the wireless signal output of the Zenneck surface waveguide probe; and
   generating a plurality of records with each of the metering devices, wherein each of the records includes at least one of the field measurements and a timestamp;
   wherein each of the metering devices includes a respective one of a plurality of clocks, wherein the method further comprises obtaining the timestamp from the respective one of the clocks.

16. The method of claim 15, further comprising positioning each of the metering devices at a respective one of a plurality distances from the Zenneck surface waveguide probe along a terrestrial medium, wherein each of the plurality of distances is unique with respect to each other.

17. The method of claim 15, further comprising communicating with each of the metering devices using the computing device to configure each of the metering devices to operate at a predefined operating frequency.

18. The method of claim 15, further comprising adjusting at least one of the field measurements based on a factor associated with a respective metering device that generated the at least one of the field measurements.

19. The method of claim 15, further comprising rendering the user interface on a display device, the user interface indicating the field strength over distance by generating a curve from select ones of the field measurements taken from the metering devices.

20. The method of claim 15, wherein the obtaining of the field measurements further comprises generating a trace of field measurements in each of the metering devices, the trace of field measurements including the plurality of field measurements across a predefined frequency band.

21. A metering device, comprising:
a passive multi-loop antenna;
at least one amplifier;
at least one bypass conductor;
a field meter configured to generate field measurements at frequencies as low as 1 Kilohertz; and
a meter controller being configured to generate a plurality of records, each of the records includes at least one of the field measurements and a timestamp, transmit each of the records to a remote computing device through a network, and alternatively couple one of the at least one amplifier and the at least one the bypass conductor between the passive multi-loop antenna and the field meter.

22. The metering device of claim 21, wherein the at least one field measurement further comprises a trace of field measurements.

23. The metering device of claim 21, wherein the meter controller obtains the at least one field measurement from the field meter in response to a request for the field measurement from the remote computing device.

24. The metering device of claim 21, wherein the meter controller includes the at least one field measurement in a record.

25. The metering device of claim 24, wherein the meter controller includes a plurality of fields in the record that indicate conditions under which the at least one field measurement was obtained.

26. The metering device of claim 21, further comprising a low pass filter coupled between the passive multi-loop antenna and the field meter, wherein a signal generated by the passive multi-loop antenna is passed through the low pass filter.

27. The metering device of claim 21, further comprising a band pass filter coupled between the passive multi-loop antenna and the field meter, wherein a signal generated by the passive multi-loop antenna is passed through the band pass filter.

28. The metering device of claim 21, further comprising a memory and wherein the at least one field measurement further comprises a plurality of field measurements, the meter controller being further configured to store the plurality of field measurements on a buffer memory before transmitting the field measurements to the remote computing device through the network.

29. The metering device of claim 21, further comprising a temperature sensor coupled to the meter controller, the temperature sensor providing a temperature of an environment local to the metering device.

* * * * *